United States Patent [19]

Fillion et al.

[11] Patent Number: 5,353,498
[45] Date of Patent: Oct. 11, 1994

[54] METHOD FOR FABRICATING AN INTEGRATED CIRCUIT MODULE

[75] Inventors: Raymond A. Fillion, Niskayuna; Robert J. Wojnarowski, Ballston Lake; Michael Gdula, Knox; Herbert S. Cole, Burnt Hills; Eric J. Wildi, Niskayuna; Wolfgang Daum, Schenectady, all of N.Y.

[73] Assignee: General Electric Company, Schenectady, N.Y.

[21] Appl. No.: 87,434

[22] Filed: Jul. 9, 1993

Related U.S. Application Data

[63] Continuation-in-part of Ser. No. 14,481, Feb. 8, 1993.

[51] Int. Cl.⁵ .............................................. H05K 3/34
[52] U.S. Cl. .................................. 29/840; 437/183; 437/209
[58] Field of Search ................. 29/830, 840, 827; 437/209, 183

[56] References Cited

U.S. PATENT DOCUMENTS

| | | |
|---|---|---|
| 3,903,590 | 9/1975 | Yokogawa ........................ 437/209 |
| 4,466,181 | 8/1984 | Takishima ........................ 437/209 |
| 4,783,695 | 11/1988 | Eichelberger et al. . |
| 4,835,704 | 5/1989 | Eichelberger et al. . |
| 4,878,991 | 11/1989 | Eichelberger et al. . |
| 4,933,042 | 6/1990 | Eichelberger et al. . |
| 5,019,946 | 5/1991 | Eichelberger et al. . |
| 5,048,179 | 9/1991 | Shindo et al. ..................... 29/840 |
| 5,091,769 | 2/1992 | Eichelberger et al. . |
| 5,108,825 | 4/1992 | Wojnarowski et al. . |
| 5,139,969 | 8/1992 | Mori .................................. 437/183 |
| 5,144,747 | 9/1992 | Eichelberger et al. . |
| 5,151,776 | 9/1992 | Wojnarowski et al. . |
| 5,154,793 | 10/1992 | Wojnarowski et al. . |
| 5,155,068 | 10/1992 | Tada . |
| 5,161,093 | 11/1992 | Gorczyca et al. . |
| 5,255,431 | 10/1993 | Burdick ........................... 29/840 |

Primary Examiner—Carl J. Arbes
Attorney, Agent, or Firm—Geoffrey H. Krauss

[57] ABSTRACT

Substrate material is molded directly to semiconductor chips and other electrical components that are positioned for integrated circuit module fabrication. Chips having contact pads are placed face down on a layer of adhesive supported by a base. A mold form is positioned around the chips. Substrate molding material is added within the mold form, and the substrate molding material is then hardened. A dielectric layer having vias aligned with predetermined ones of the contact pads and having an electrical conductor extending through the vias is situated on the hardened substrate molding material and the faces of the chips. A thermal plug may be affixed to the backside of a chip before substrate molding material is added. A connector frame may be placed on the adhesive layer before substrate molding material is added. A dielectric layer may be placed over the backsides of the chips before the substrate molding material is added to enhance repairability. A portion of the chips and substrate molding material may be removed after the substrate molding material is hardened.

46 Claims, 18 Drawing Sheets

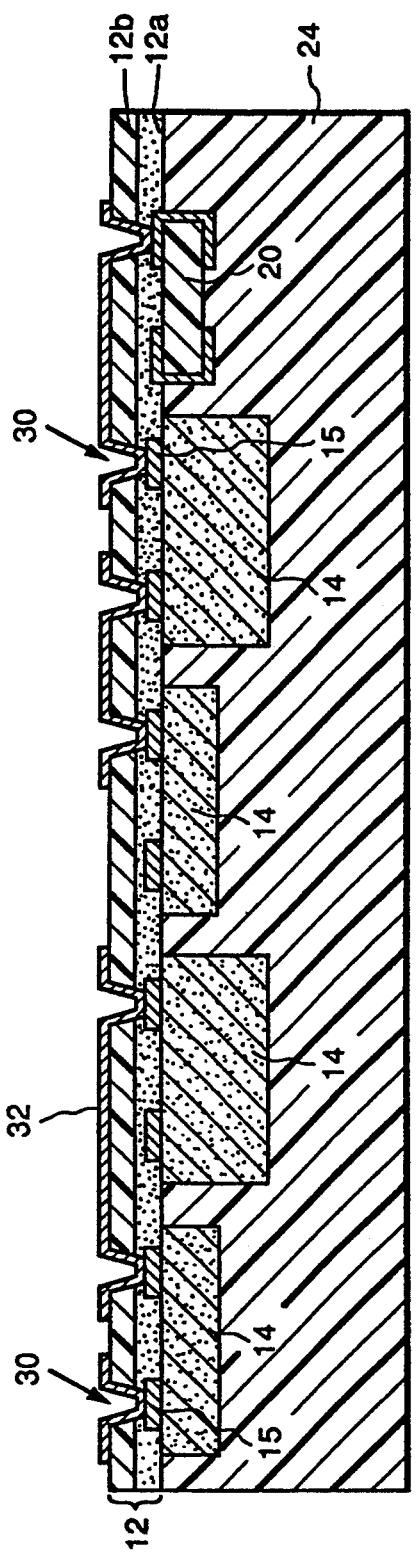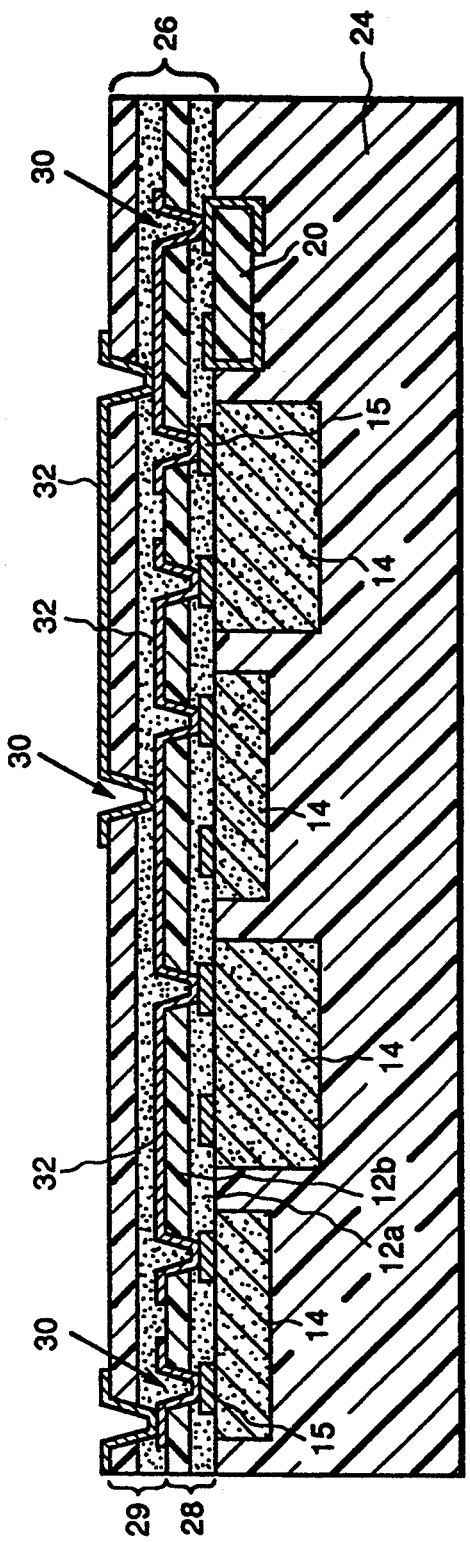
FIG. 1(d)
FIG. 1(e)

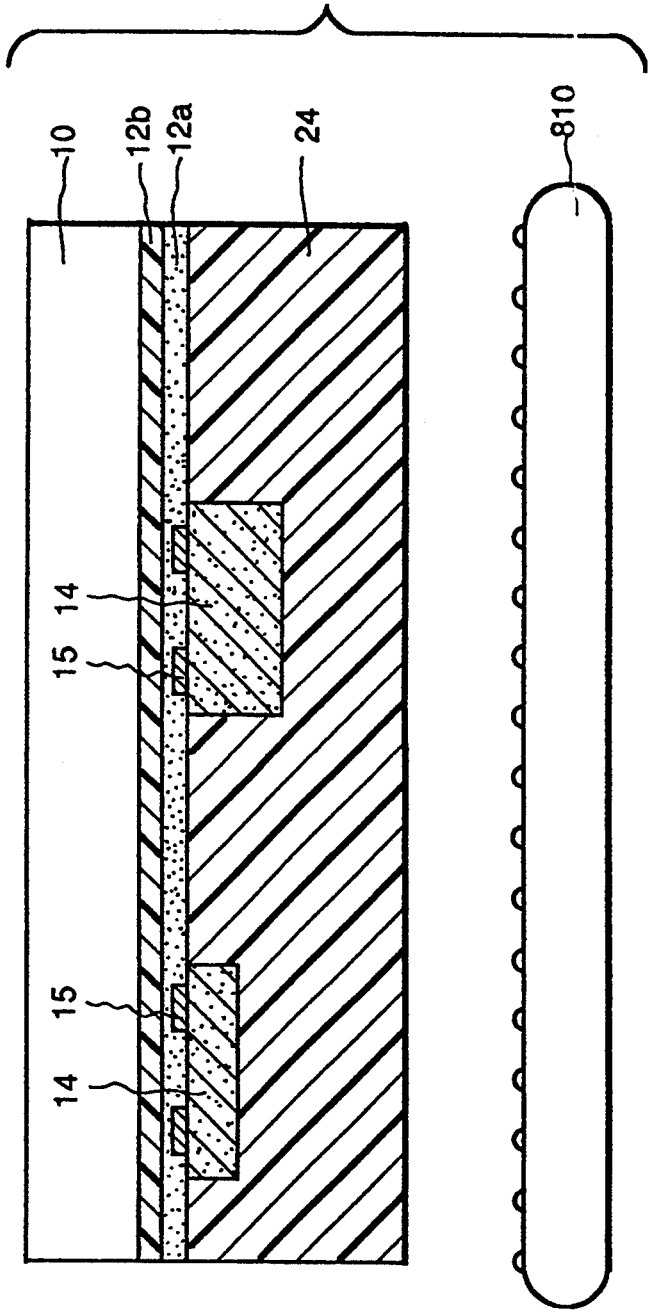

METHOD FOR FABRICATING AN INTEGRATED CIRCUIT MODULE

CROSS-REFERENCE TO RELATED APPLICATIONS

This application is a continuation-in-part of commonly assigned application Ser. No. 08/014,481, filed Feb. 8, 1993. The application is related to the following co-pending applications which are assigned to a common assignee and incorporated herein by reference: Wojnarowski, "Thinning of Integrated Circuit Chips for Lightweight Packaged Electronic Systems and Systems Produced Therefrom," application Ser. No. 07/962,379, filed Oct. 16, 1992; and Fillion et al., "Integral Power and Ground Structure for Multi-chip Modules," application Ser. No. (attorney's docket number RD-22,901), filed concurrently herewith.

BACKGROUND OF THE INVENTION

1. Field of the Invention

This invention relates generally to fabrication of substrates for multi-chip modules and other integrated circuit modules, and, more particularly, to fabrication of a substrate for an integrated circuit module by molding material around semiconductor chips, except for chip surfaces containing contact pads.

2. Description of the Related Art

Conventional high density interconnect (HDI) processes often use cavities formed into a substrate base for the placement of chips so that the top surfaces of the chips are essentially planar with the surface of the substrate. The substrate is generally a ceramic or a composite structure. The conventional HDI technique for fabricating cavities in the substrate is to mechanically machine or mill out the cavity material with a computer-controlled diamond tooled bit. This time consuming process does not always provide the desired chip cavity depth and can result in cracks which render the substrate unusable.

In the conventional HDI process, chips are placed into cavities on multiple drops of die attach adhesive for mechanical, thermal, and electrical mounting. Chips placed with this process often are displaced during further processing because there are non-uniform surface tension forces at the chip-to-die attach adhesive inter-face. This displacement reduces precision in chip location, and further processing steps are required to adapt each electrical interconnection to the chip misalignment.

Eichelberger, U.S. Pat. No. 5,091,769, issued Feb. 25, 1992, describes an integrated circuit package formed by placing integrated circuit chips backside down on a substrate, encapsulating the faces and sides of the chips, fabricating vias and interconnections through the encapsulant to the contact pads for testing and burn in procedures, and removing the encapsulant after testing. When chips of differing thicknesses are used in a single multi-chip module (MCM), their pads are not situated in a common plane, so this method requires either that some of the chips be thinned or that the vias be of varying depths. Additionally, this technique involves a step of mechanical grinding for planarizing the surface and the use of an encapsulant material which is removed after testing.

SUMMARY OF THE INVENTION

Accordingly, an object of the invention is to provide a method for positioning contact pads of a plurality of chips with differing thicknesses on a planar surface without milling chip wells or thinning chips.

Another object of the invention is to provide an easily implemented, high yield and high reliability process for precisely positioning chips in a substrate with improved thermal cooling paths and for providing the chips with electrical connection to external circuitry.

Yet another object of the invention is to provide a method for chip placement and alignment such that the positions of the chip contact pads are precisely aligned.

Briefly, according to a preferred embodiment of the invention, a method of fabricating an integrated circuit module substrate on a base comprises applying an insulative base sheet over the base. At least one chip having contact pads is placed face down on the base sheet including an adhesive. A mold form is positioned around a desired perimeter and surrounds at least one chip. Substrate molding material is added and then hardened within the mold form.

According to another preferred embodiment of the invention, chips having contact pads are disposed on a base sheet with the contact pads in contact with the base sheet. The base sheet is comprised of an adhesive layer on a polymer film layer which is disposed on a base comprised of any convenient structural material. A mold form is disposed on the adhesive layer, surrounding the chips. A polymeric molding material is added to the mold form encapsulating all surfaces of the chips except the surfaces containing the contact pads which are in contact with the adhesive layer, and is hardened. The mold form and the supporting base are removed following the hardening of the molding material and the curing of the adhesive layer. The base sheet then serves as a dielectric layer for a high density interconnect (HDI) structure which is subsequently formed. A plurality of vias are disposed through the base sheet in alignment with predetermined contact pads on the chips. An electrical connection is made to the contact pads through a pattern of electrical conductors which overlies the base sheet. The base sheet and pattern of electrical conductors form an interconnect layer over which one or more additional interconnect layers may be subsequently applied.

In another preferred embodiment of the invention, the aforementioned base sheet comprising the adhesive layer and polymer film layer is removed following the hardening of the molding material. After the top surface of the chips and molding material is cleaned, a polymeric film is bonded to that surface with an adhesive to form the dielectric layer.

In still another preferred embodiment of the invention, the base sheet comprises an adhesive layer only, which is applied directly to the base structure. Following the hardening of the mold material, the supporting base structure is separated from the adhesive layer. A film layer is then bonded to the molded substrate by curing the adhesive layer to form the dielectric layer.

In yet another preferred embodiment of the invention, an inner dielectric layer overlies the backside of the chips prior to the addition of the molding material for providing air gaps and easing repair processes.

According to another preferred embodiment of the invention, a method of fabricating an integrated circuit module substrate comprises placing a plurality of chips having contact pads face down on a vacuum plate and applying a continuous vacuum to the vacuum plate. A mold form is positioned around the chips, and substrate molding material is added within the mold form. The substrate molding material is hardened and separated from the vacuum plate. A dielectric layer is applied over the chips and the substrate molding material. A plurality of vias are formed through the dielectric layer with some of the vias being aligned with predetermined ones of the contact pads. A pattern of electrical conductors is applied through selected ones of the plurality of vias in the dielectric layer.

According to yet another embodiment of the invention, a plastic molded substrate is thinned using a mechanical grinding machine, thus resulting in a module having lower weight and less volume. A plurality of such thinned substrates can be bonded and interconnected in a stack assembly.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawings, where like numerals represent like components, in which:

FIG. 1(d) is a view similar to that of FIG. 1(c), further showing vias and electrical connections in the adhesive coated film layer;

FIG. 1(e) is a view similar to that of FIG. 1(d), further showing interconnect layers;

FIG. 8(a) is a view similar to that of a portion of FIG. 1(b), further showing a grinding fixture for reducing substrate and chip thicknesses;

DETAILED DESCRIPTION OF A PREFERRED EMBODIMENT OF THE INVENTION

Figure 1A:
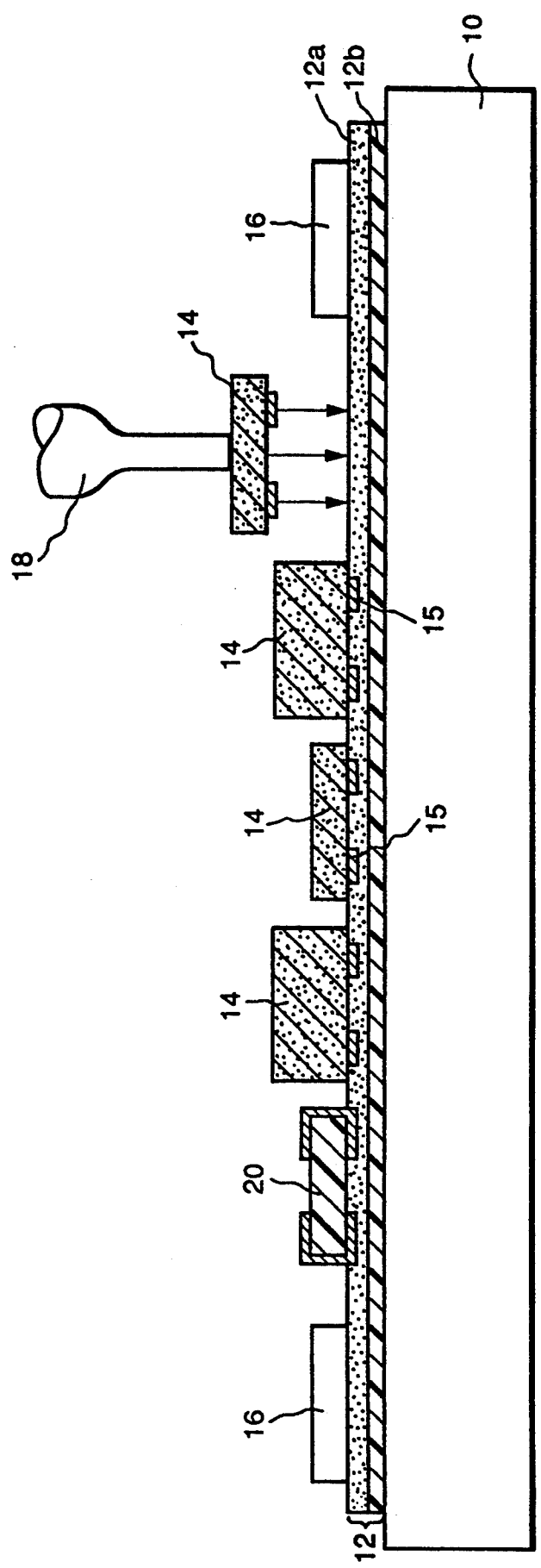
FIG. 1(a) is a sectional side view of chips placed face side down on an adhesive coated film layer, which may comprise a portion of an interconnect layer in the completed module.

FIG. 1(a) is a sectional side view of chips, represented by a capacitor 20 and semiconductor chips 14, placed face side down on a base sheet 12 supported by a base 10. Base sheet 12 can be comprised of a film layer 12b, such as Kapton polyimide (Kapton is a trademark of E.I. dupont de Nemours and Co.), coated with a contact adhesive layer 12a, such as Ultem polyetherimide resin (Ultem is a registered trademark of General Electric Company, Pittsfield, Mass.) or an epoxy/polyimide copolymer blend such as that disclosed in commonly assigned Wojnarowski et al., U.S. Pat. No. 5,108,825, issued Apr. 28, 1992, which is herein incorporated by reference. Solvent die attach may be used, as described in commonly assigned Eichelberger et al., "High Density Interconnect Thermoplastic Die Attach Material and Solvent Die Attach Processing", U.S. application Ser. No. 07/745,982, filed Aug. 5, 1991, which is herein incorporated by reference. The phrase "face side down" means that contact pads 15 are in contact with adhesive layer 12a. Base 10 may comprise any structural material, such as, for example, plastic, ceramic, or metal.

A chip may comprise any electrical circuit component, including semiconductor chips, such as integrated circuits (ICs), and discrete devices, such as, for example, capacitors, resistors, inductors, and transducers. Chips 14 or 20, which need not have the same thickness, may be placed in contact with adhesive layer 12a in any conventional manner. In one embodiment, a pick-and-place machine 18 (partially shown) is used. In another embodiment, chips are placed precisely on a temporary surface such as wax or a film having low contact adhesion, such as a wafer membrane of the types fabricated by Nitto Co. (known as "Nitto Tape") and Semiconductor Equipment Corp. (known as "Blue Membrane"), and then the chips, while still attached to the temporary surface, are placed face down on base sheet 12. The use of a temporary surface is most effective when the chips have similar thicknesses.

Base sheet 12, comprised of adhesive layer 12a and polymer film layer 12b, may be used as the first dielectric layer for an HDI structure which typically comprises a thermoplastic or thermoset adhesive applied to a fully cured polymeric film. Alternatively, base sheet 12 may be a sacrificial layer which is removed after molding, as further discussed with respect to FIGS. 2(a) and 2(b). If the base sheet is used as a first dielectric layer, then preferably both the adhesive and polymer film layers are laser ablatable at wavelengths of 350–370 nm.

In a preferred embodiment, an optional sheet frame 16 is used to keep base sheet 12 flat on the surface of base 10. The frame is typically comprised of molybdenum, titanium, or stainless steel, but may comprise any appropriate structural material. After chip attachment, procedures such as palladium/chloride seed plating, sputtering, and vapor deposition may be used to cover the chips with electrically conductive material as disclosed in commonly assigned Wojnarowski et al., U.S. Pat. No. 5,151,776, issued Sep. 29, 1992, which is herein incorporated by reference.

Figure 1B:
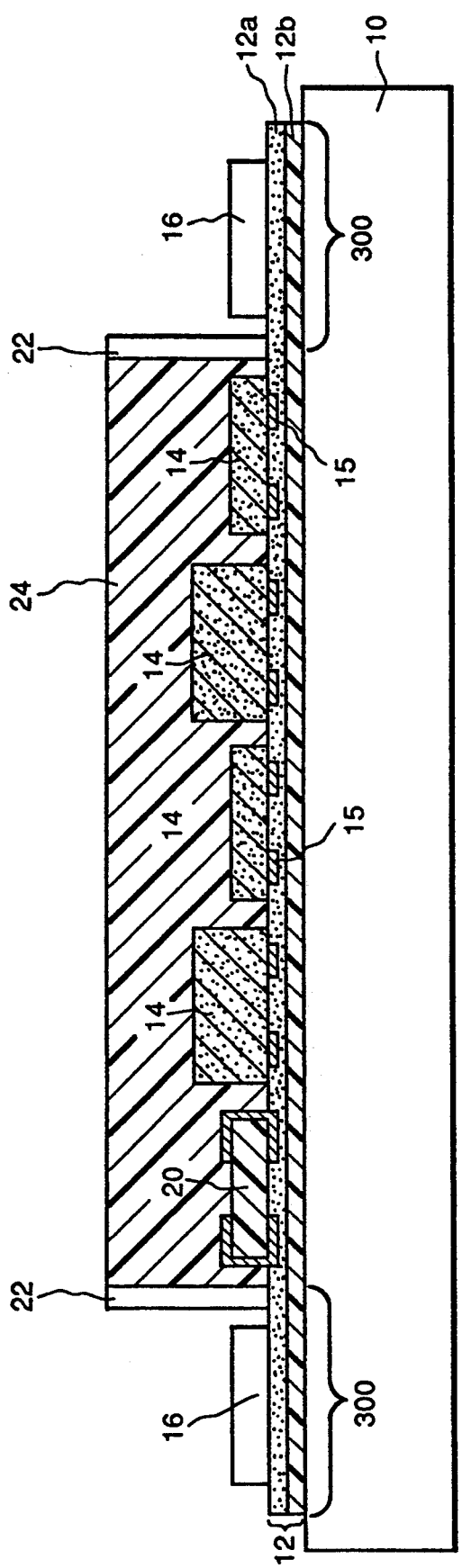
FIG. 1(b) is a view similar to that of FIG. 1(a), further showing a mold form situated around the chips and containing molding material.

FIG. 1(b) is a sectional side view of the apparatus of FIG. 1(a), further showing a mold form 22 situated around the chips and filled with a substrate molding material 24. Mold form 22 can comprise any appropriate structural material including, for example, plastic or metal and can either remain with the molded substrate during further processing or be removed after preparing the mold. A removable mold form can be either sacrificial or reusable. If the mold form is reusable, it is useful to spray on a release agent (not shown), such as Teflon polytetrafluoroethylene (Teflon is a trademark of E.I. duPont de Nemours and Co.), silicone, or a no-stick vegetable oil before filling the mold form with the molding material.

Potential substrate molding materials include, but are not limited to, aliphatic and aromatic polymers including thermoplastic and thermoset type polymers and blends of various polymers such as Ultem polyetherimide resin, acrylates, polyurethanes, Teflon polytetrafluoroethylene, epoxies, benzocyclobutene (BCB), polyimides, or other polymers. One important consideration when selecting a molding material is that it must be able to withstand subsequent processing steps and end usage environment.

The molding material will likely include therein filler material in a configuration of particles, fibers, screens, mats, or plates. The type and amount of filler material can be used to tailor various molding material properties, such as thermal conductivity and coefficient of thermal expansion, to meet module requirements. For example, these materials can include inorganic particles of glass, SiC, $Al_2O_3$, or AlN, particles of diamond or graphite, or metal particles of silver or copper. Glass, SiC, AlN, diamond, and graphite have low coefficients of thermal expansion, whereas polymers and metals have higher coefficients of thermal expansion. The thermoconductive materials include SiC, AlN, copper, graphite, and diamond, with graphite and diamond being the better conductors.

The substrate molding material is poured or injected into the mold form in a manner optimizing environmental conditions such as temperature, atmosphere, voltage, and pressure, to minimize voids, stresses, shrinkage and other potential defects. For example, the process works best when performed in a vacuum. Preferably, the processing temperature does not exceed 300° C.

If the area of base sheet 12 is greater than the area of the mold form, a portion, depicted as removable section 300, of the base sheet can be trimmed before the base sheet is used in an HDI overlay structure (shown in FIGS. 1(d) and 1(e)). Alternatively, removable section 300 can be trimmed after module fabrication has been completed.

Figure 1C:
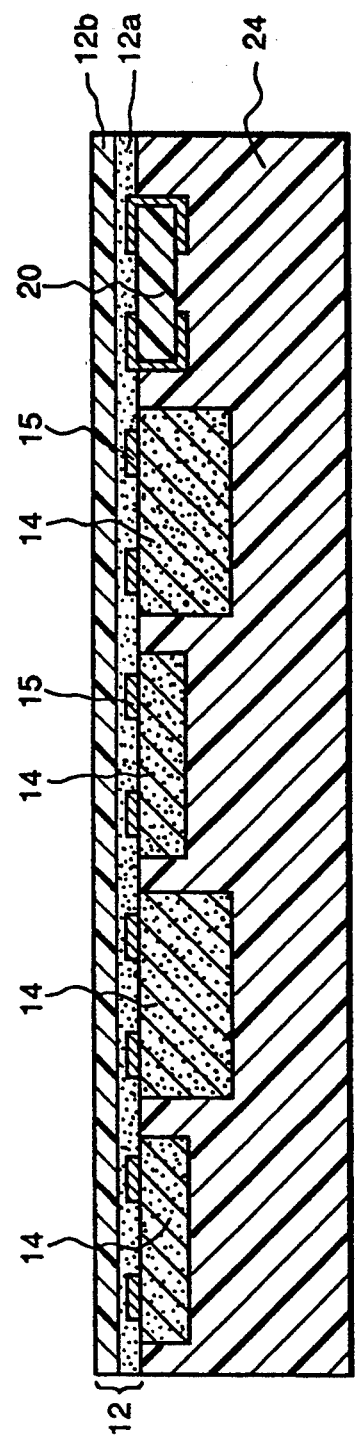
FIG. 1(c) is view similar to that of FIG. 1(b), further showing embedded chips in substrate molding material after the mold form has been removed.

FIG. 1(c) is a sectional side view of the apparatus of FIG. 1(b) showing embedded chips after mold form 22 (shown in FIG. 1(b)) has been removed from molding material 24 and the base sheet 12 has been trimmed and separated from base 10. The substrate molding material is ready to be removed from the mold form after the molding material 24 is hardened (i.e., set with irradiation or cured at room temperature or with heat) into a molded substrate. Removal of the mold form can be facilitated if a release agent, such as Teflon polytetrafluoroethylene or vegetable oil, has been applied to the mold form. For epoxy molding material, a sprayed-on silicone mold release agent is preferred.

Base sheet 12 may be left in place on the surface of the molded substrate and the top surfaces of the IC chips and passive components. Typically adhesive layer 12a is a thermoplastic or thermoset material. Because the chips were placed face down before the molding process, the resulting surface of the molded substrate and chips is virtually planar, facilitating application of conventional HDI overlay structures (shown in FIG. 1(d)). This exposed surface can be treated with a short plasma $O_2$ etch or RIE (reactive ion etch) exposure to promote adhesion during further processing.

In one embodiment, adhesive layer 12a is hardened before the molding material is added, and the molding material is hardened at a later time. In a preferred embodiment, the adhesive layer and the molding material are cured during a single heating step, thus reducing the number of processing steps. A single curing step works well if the adhesive layer and the molding material are fabricated of the same material, especially a thermosetting material.

Several examples of specific molding material and processing steps are discussed in the following paragraphs to describe potential specific molding techniques. The typical size of the mold is 2 inches long, 2 inches wide, and 50-60 mils high.

In a first example, a molding material is prepared by blending 50 g of SPI-135 solution (a siloxane-polyimide available from MicroSi Corp., Phoenix, Ariz.) with 50 g of a cycloaliphatic epoxy (CY-179, available from Ciba Geigy Corp.) which contains 1% by weight of an onium salt crosslinking catalyst, Octacat (available from GE Silicone Products, Waterford, N.Y.). Other epoxy catalysts or co-catalysts, such as, for example, benzopinacol, copper naphthenate, and FC 520 (trifflic acid salt, available from 3M Corp.), can be used without sacrifice in performance or the ability to crosslink the molding material. This molding material is poured into the mold and baked for two hours at 100° C. under slight vacuum conditions to remove all solvents and bubbles. The mold is then heated for two hours at 130° C. followed by two hours at 180° C. to completely harden the molding material. These temperatures and times are for example only; they can be varied as desired. The preferred temperature range includes temperatures between 25° C. and 250° C.

In a second example, a molding material is prepared by blending 50 g of Epon 828 (available from Shell Chemical), 50 g of D.E.N. 438, 5 g D.E.R. 732 (D.E.N. and D.E.R. available from DOW Chemical), 0.1 g of copper naphthenate blend from Mooney Chemical, and 1 g of Octacat crosslinking catalyst. The material is blended for one hour at 100° C., poured into the mold form, is heated for three hours at 130° C., and then heated for five hours at 180° C. to harden the molding material.

In a third example, 50-200 g (typically 100 g) of finely powdered alumina (preferably particles having diameters less than 10 microns) is mixed with the blend of example two before the molding material is poured into the mold form. The mixture is heated as in example two, resulting in a composite molding material with improved thermal conductivity. Other materials such as aluminum nitride, aluminum silicon carbide, aluminum, or diamond particles can be blended and heated in a similar manner.

In a fourth example, molding material comprising 20 g of a siloxane polyimide polymer is dissolved in 80 g of Cy-179 (available from Ciba Geigy Corp.), which is then blended with 0.8 g of Octacat and 0.1 g of copper naphthenate at 100° C. The material is then combined, poured into a mold, and heated for three hours at 130° C., followed by five hours of heating at 180° C.

In a fifth example, an epoxy solution is prepared as described in the first example. A 1 mil thick Kapton polyimide film is surface-treated with an $O_2$ plasma reactive ion etch sequence to cause surface roughness and thus achieve improved adhesion. A portion of the epoxy solution is then spin coated on the Kapton polyimide film to result in a composite film of Kapton polyimide with a ½ mil thickness of the dried epoxy adhesive thereon. The film is baked at 100° C. for one hour to remove solvent and results in a ½ mil tack free film on one surface of the Kapton polyimide. The chips are placed face side down on the epoxy side of the film. The film is kept at about 100° C., and some pressure is applied to the chips during placement to imbed the contact pads of the chips into the epoxy layer which is relatively soft at this temperature. Solvent die attach may be used for this purpose also, as described in aforementioned Eichelberger et al., U.S. application Ser. No. 07/745,982. The mold form is placed around the chips and an additional portion of the epoxy solution (which has previously been heated to 100° C. to remove solvent) is poured hot over the backside of the chips, thus filling the mold. The entire structure is then heated for two hours at 130° C. and two hours at 180° C. to harden the mold material and the adhesive used to bond the chip to the Kapton polyimide (both of which comprise the epoxy solution).

Although using a thermoset adhesive layer, such as an epoxy, restricts rework processes, it is recommended for the dielectric layer adjacent to chips 14 because it permits lower HDI processing temperatures and allows for higher post fabrication processing and field application temperatures than thermoplastic adhesives.

FIG. 1(d) is a sectional side view of the apparatus of FIG. 1(c), further showing via openings 30 and a pattern of electrical conductors 32 which connect contact pads 15 on chips 14 and 20. Base sheet 12 forms the dielectric layer that, with electrical conductors 32, functions as a first interconnect layer 28 (FIG. 1(e)).

FIG. 1(e) is a sectional side view of the apparatus of FIG. 1(d), further showing a multi-layer HDI structure 26 situated on molded substrate 24 and including chips 20 and 14. HDI structure 26 includes first interconnect layer 28 comprising a dielectric layer with via openings 30 and supporting a pattern of electrical conductors 32, as well as an optional second interconnect layer 29 disposed over first interconnect layer 28. Additional interconnect layers could be applied, if desired. Methods of forming and filling via openings 30, methods of patterning electrical conductors 32, and methods of fabricating one or more upper interconnect layers 29 are described in Gorczyca et al., U.S. Pat. No. 5,161,093, issued Nov. 3, 1992, Eichelberger et al., U.S. Pat. No. 4,835,704, issued May 30, 1989, and Eichelberger et al., U.S. Pat. No. 4,783,695, issued Nov. 8, 1988, each of which is commonly assigned and herein incorporated by reference.

Figure 2A:
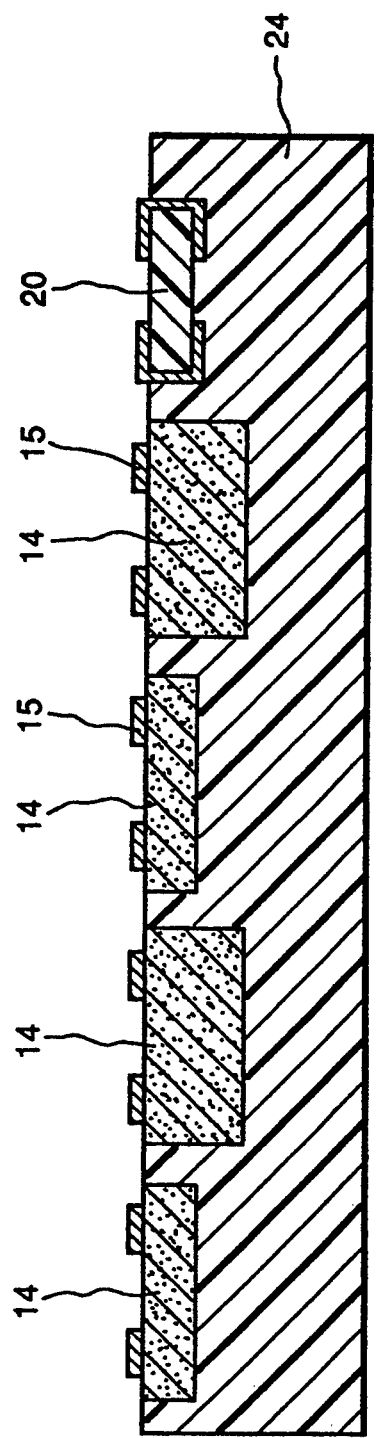
FIG. 2(a) is a view similar to that of FIG. 1(c), after removal of the adhesive coated film which, in this embodiment, is sacrificial rather than a portion of an interconnect layer.
Figure 2B:
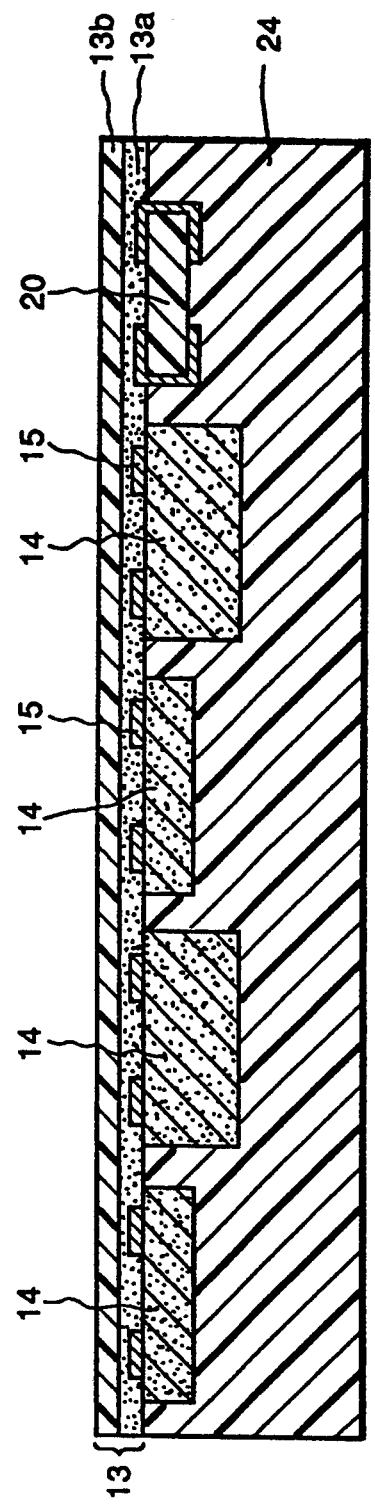
FIG. 2(b) is a view similar to that of FIG. 2(a), further showing another adhesive coated polymer film on the chip and hardened substrate material.

FIGS. 2(a) and 2(b) are sectional side views of an alternative embodiment of the invention similar to that shown in FIGS. 1(a)-1(e). In this embodiment base sheet 12 (such as shown in FIG. 1(c)), which comprises a contact adhesive 12a coated on a polymer film 12b, is removed from the molded substrate 24 and chips 14 and 20. The base sheet is readily removed from the molded substrate if the adhesive film is selected for its low contact adhesion, such as, for example, wafer membranes of the types fabricated by Nitto Co. (known as "Nitto Tape") and Semiconductor Equipment Corp. (known as "Blue Membrane"). FIG. 2(a) is a view of molded substrate 24 and the chips supported thereon after removal of base sheet 12. FIG. 2(b) is a sectional side view of the apparatus of FIG. 2(a), further showing a dielectric layer 13 thereon comprised of an adhesive layer 13a and a polymer film 13b. This forms the first dielectric layer, and a structure similar to that illustrated in FIGS. 1(c)-1(e) can then be fabricated.

Figure 3A:
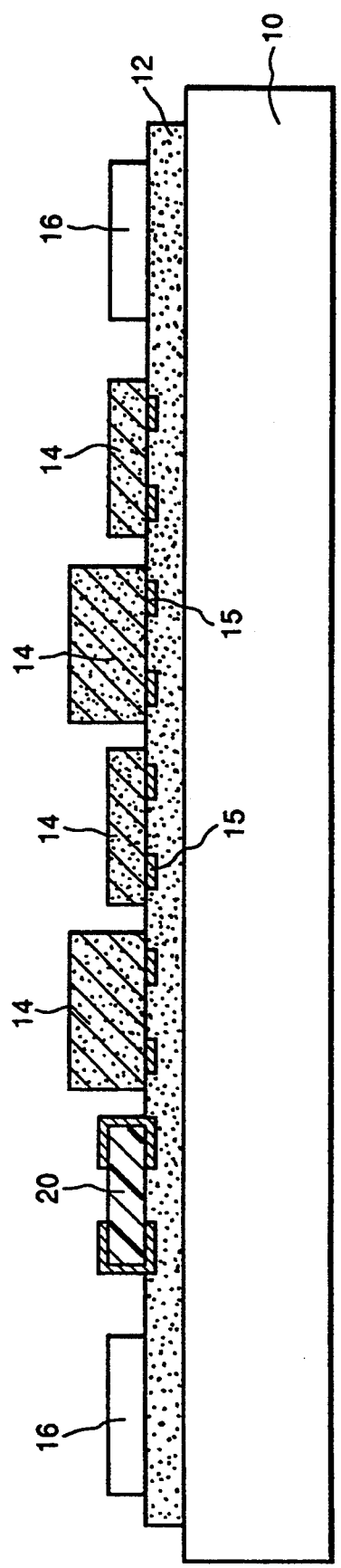
FIG. 3(a) is a sectional side view of chips placed face side down on an adhesive layer supported by a base.
Figure 3B:
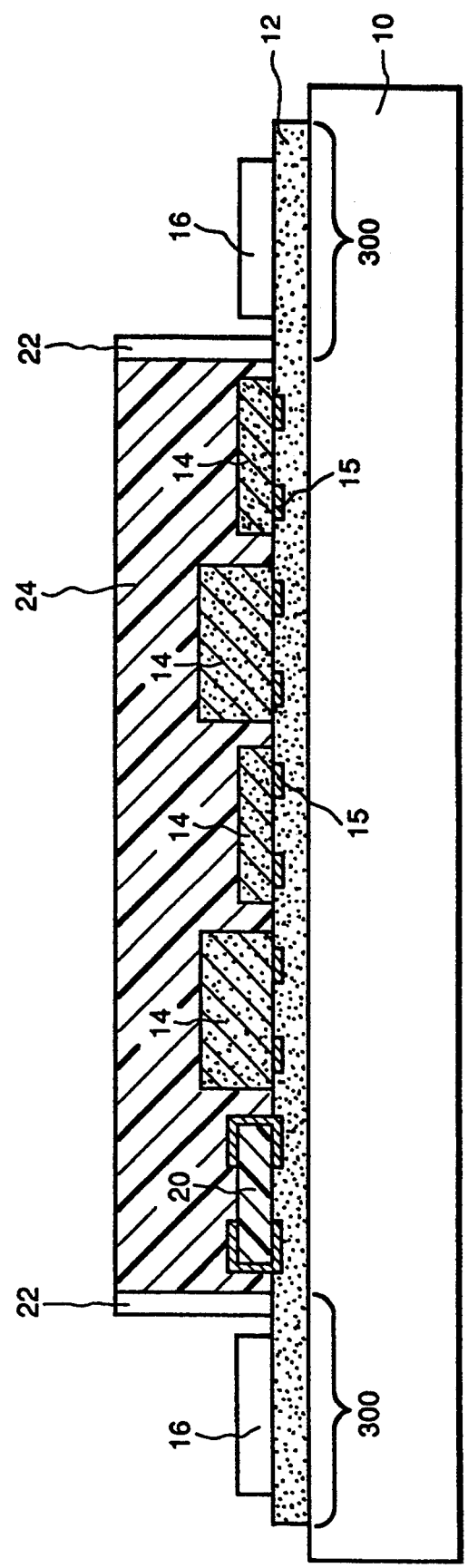
FIG. 3(b) is a view similar to that of FIG. 3(a), further showing a mold form situated around the chips and containing molding material.
Figure 3C:
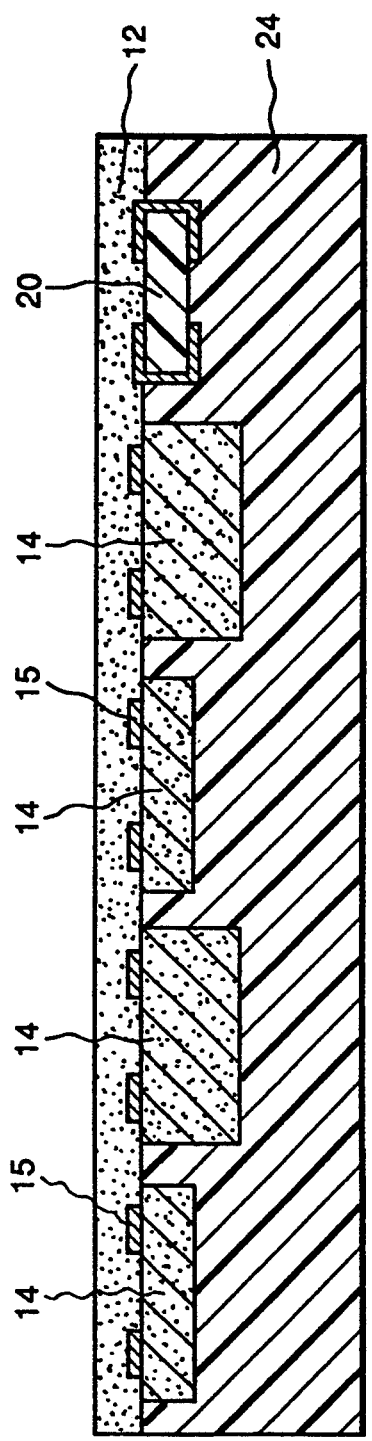
FIG. 3(c) is a view similar to that of FIG. 3(b), further showing the embedded chips in the substrate molding material which has been removed from the mold form, has had the base removed, and has been flipped over with the adhesive layer intact on the surface of the chips and the molded substrate.
Figure 3D:
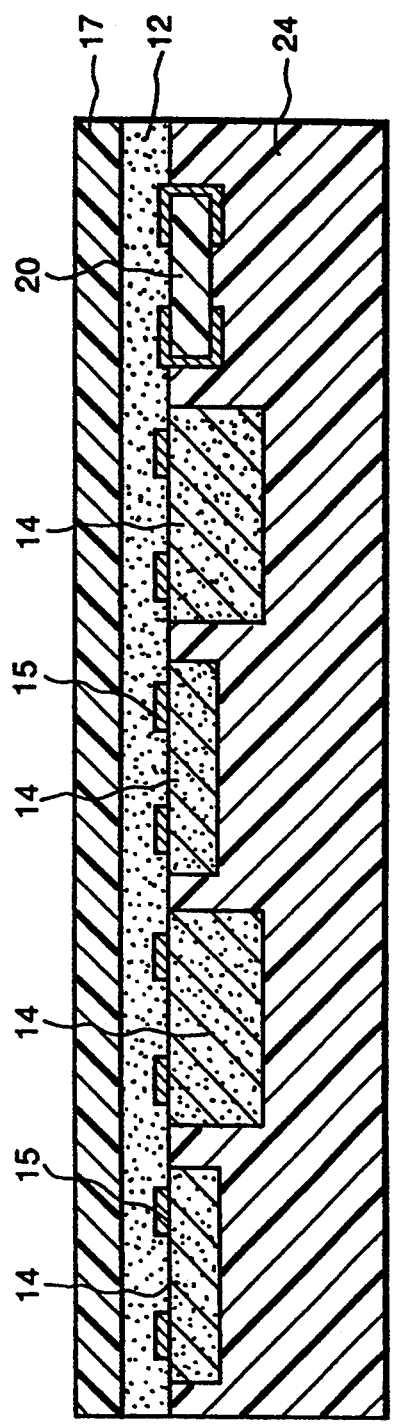
FIG. 3(d) is view similar to FIG. 3(c), further showing a polymer film applied to the adhesive layer.

FIGS. 3(a)–3(d) are sectional side views of another alternative embodiment of the invention which is similar to that shown in FIGS. 1(a)–1(e). In this embodiment, however, base sheet 12 comprises an adhesive layer (such as Ultem polyetherimide resin) applied directly to base 10, as shown in FIG. 3(a), with no adjacent polymer film layer (such as layer 12b of FIG. 1(a)). Base 10, or the surface treatment of it, must be selected such that base sheet 12 will remain on molded substrate 24 after the base is removed. The substrate is molded with molding material 24, as shown in FIG. 3(b), in a manner similar to that for the apparatus of FIG. 1(b). FIG. 3(c) is a view similar to that of FIG. 3(b), showing the structure of FIG. 3(b) after removal of mold form 22 and base 10. FIG. 3(d) is a view similar to that of FIG. 3(c) further showing a polymer film layer 17 laminated to the molded substrate 24 through adhesive base sheet 12 by, for example, using heat and pressure or solvent and pressure. A preferred lamination technique is described in commonly assigned Eichelberger et al., U.S. Pat No. 4,933,042, issued Jun. 12, 1990, which is herein incorporated by reference. Film 17 may be pretreated with a plasma or RIE (reactive ion etching) for enhanced adhesion. A dielectric layer is thus formed on chips 14 and 20, and a method similar to that discussed with respect to FIGS. 1(c)–1(e) can be followed to fabricate an HDI structure.

Figure 4A:
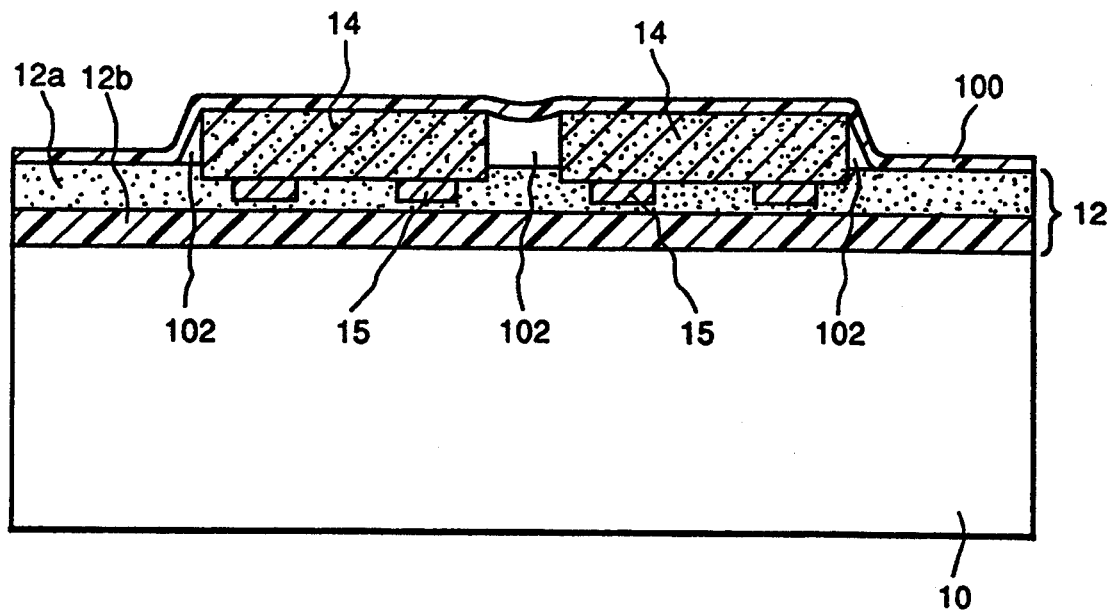
FIG. 4(a) is a view similar to that of FIG. 1(a), showing an inner dielectric layer over the chips and the adhesive coated film layer.
Figure 4B:
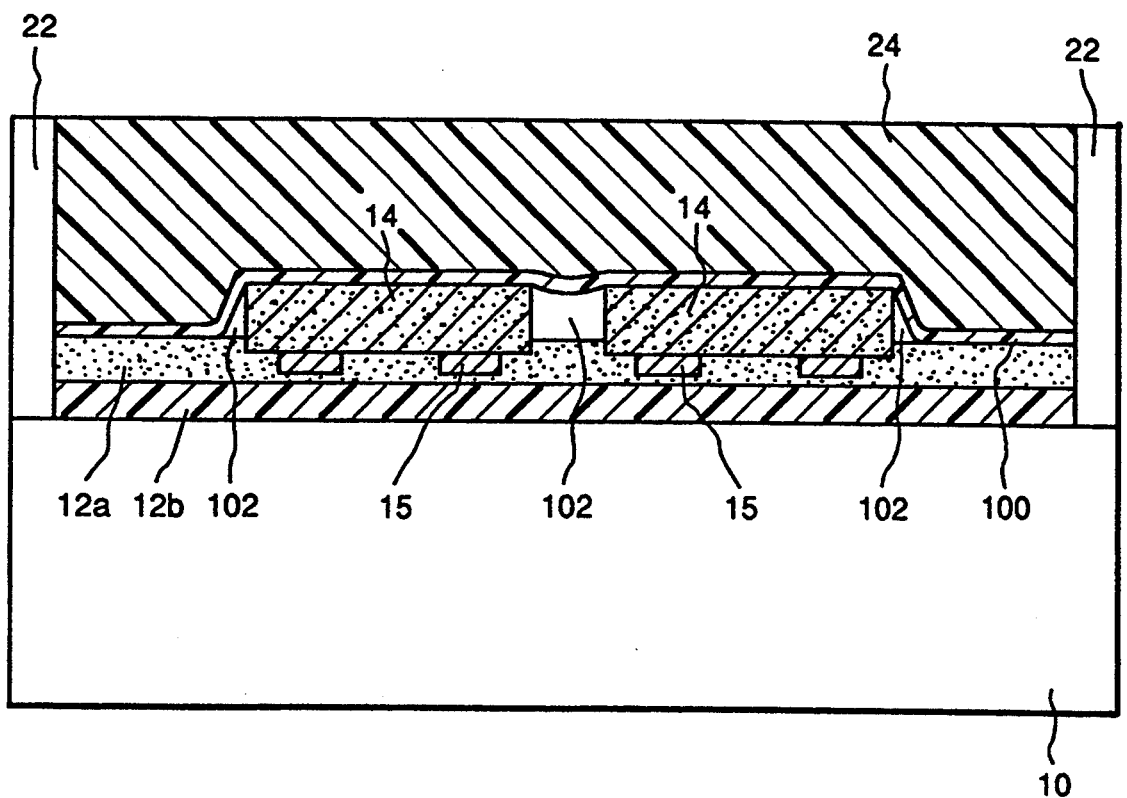
FIG. 4(b) is a view similar to that of FIG. 4(a), further showing a mold form situated around the chips and containing a substrate molding material.

FIGS. 4(a)–4(c) and 4(e) are sectional side views of alternative embodiments of the invention which are similar to the views shown in FIGS. 1(a)–1(e). The embodiment of FIG. 4(a) is similar to that of FIG. 1(a) except that it further includes an inner dielectric layer 100, such as, for example, adhesive coated Kapton polyimide, overlying the backsides of chips 14. Dielectric layer 100 is applied to the chips prior to substrate molding material 24 (shown in FIG. 4(b)). The use of two chips, as opposed to five, is merely for simplicity of illustration; any number of chips can be used. Also, as shown in FIGS. 1(a)–3(d), the chips shown in FIGS. 4(a)–4(e) may have differing thicknesses.

The addition of inner dielectric layer 100 provides air gaps 102 between chips 14 and base sheet 12. These air gaps reduce stress on the module and relax the need for chips 14 and substrate molding material 24 to have a similar coefficient of thermal expansion. Another advantage of inner dielectric layer 100 is that a chip may be removed and replaced from an HDI structure using the convenient repair processes described in Wojnarowski et al., U.S. Pat. No. 5,154,793, issued Oct. 13, 1992, and Eichelberger et al., U.S. Pat. No. 4,878,991, issued Nov. 7, 1989, which are commonly assigned and herein incorporated by reference. New chips may be replaced using an epoxy die attach material, preferably silver, and rebuilding the interconnections. Although not shown in the figures, inner dielectric layer 100 can also be used in the embodiments of FIGS. 2(a)–2(b)–3-(a)–3(d)–5(a)–5(b), and 6(a)–6(b).

Figure 4C:
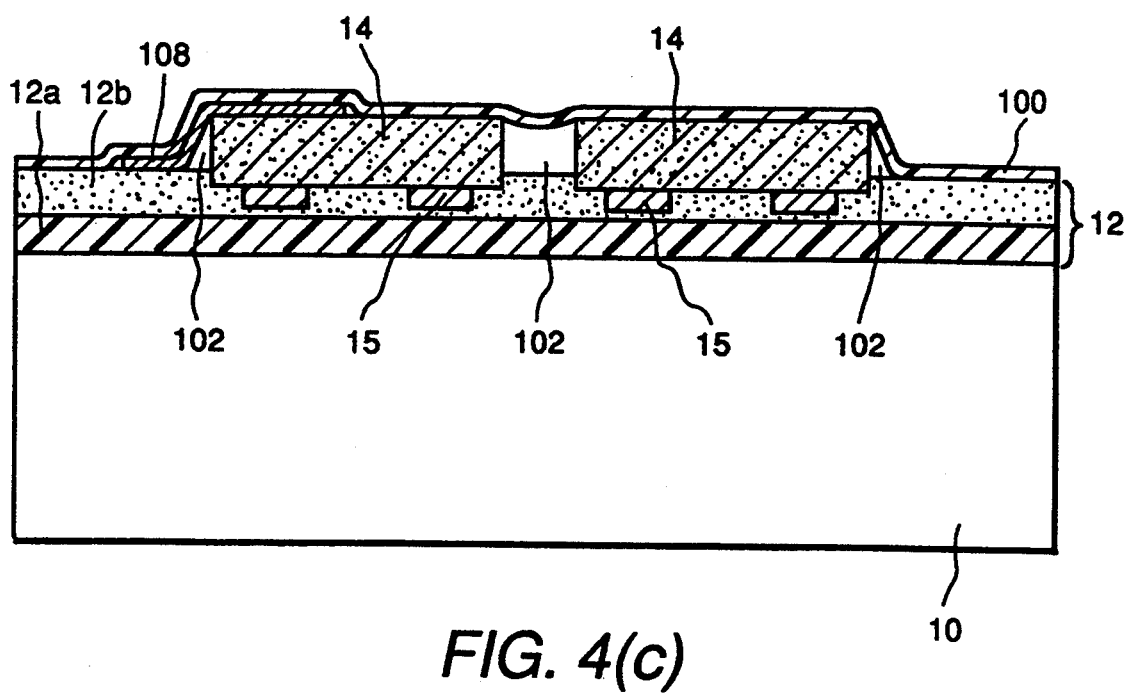
FIG. 4(c) is a view similar to that of FIG. 4(a), further showing an electrically conductive strip positioned between the inner dielectric layer and the chip/substrate surface.

The embodiment of FIG. 4(c) further includes an electrically conductive strip, plate, or well, shown as strip 108, beneath inner dielectric layer 100. The strip comprises a ductile conductive material such as aluminum, gold, or copper, and in one embodiment has a thickness of four microns. One method for applying strip 108 to inner dielectric layer 100 is to place the inner dielectric layer on a support base and use the metallization and patterning processes described in aforementioned U.S. Pat. No. 4,783,695. Strip 108 is positioned so that, when inner dielectric layer 100 is put down on the chips, one portion of strip 108 is in contact with the backside of a chip and another portion of strip 108 is on base sheet 12. Fine precision in placement of strip 108 is not required; the strip is effective so long as it touches any portion of a chip and any portion of the base sheet. Preferably either the backside of the chip or the strip is coated with silver epoxy die attach material (not shown) to improve electrical contact.

Figure 4D:
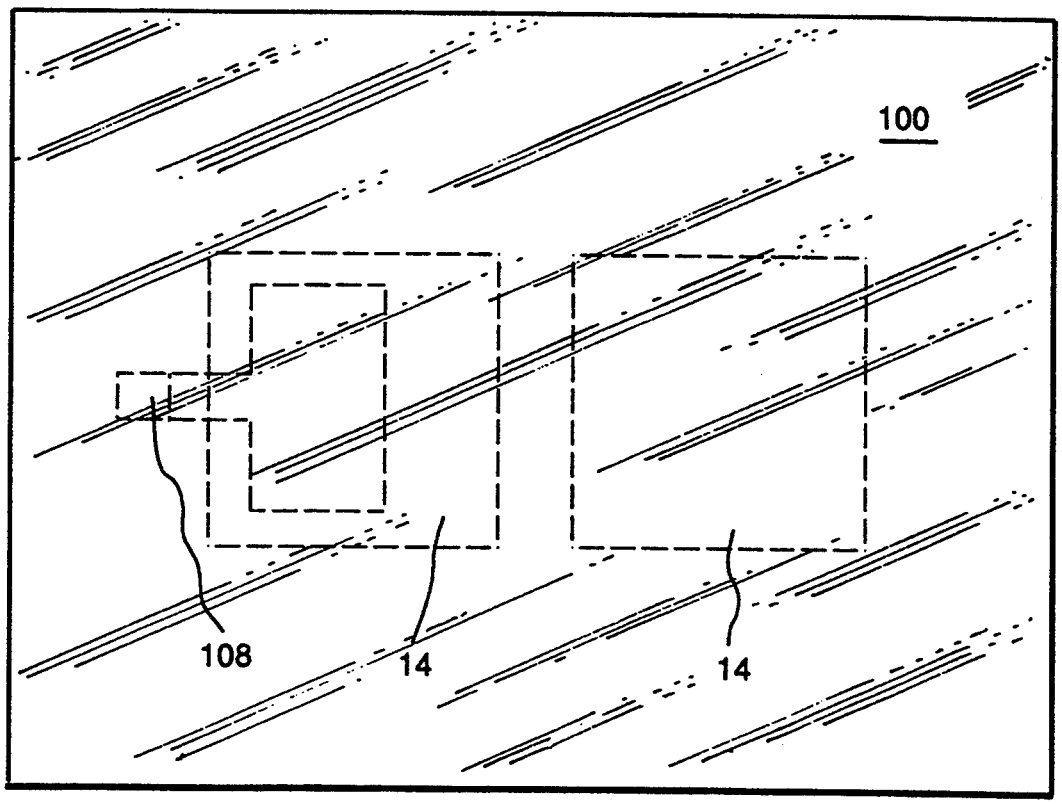
FIG. 4(d) is a top view of the embodiment shown in FIG. 4(c)

FIG. 4(d) is a top view of the structure of FIG. 4(c), showing the location of conductive strip 108 relative to one of chips 14. This strip may be used, for example, to ground the chip to which it makes contact, or to supply a desired voltage to the chip.

Figure 4E:
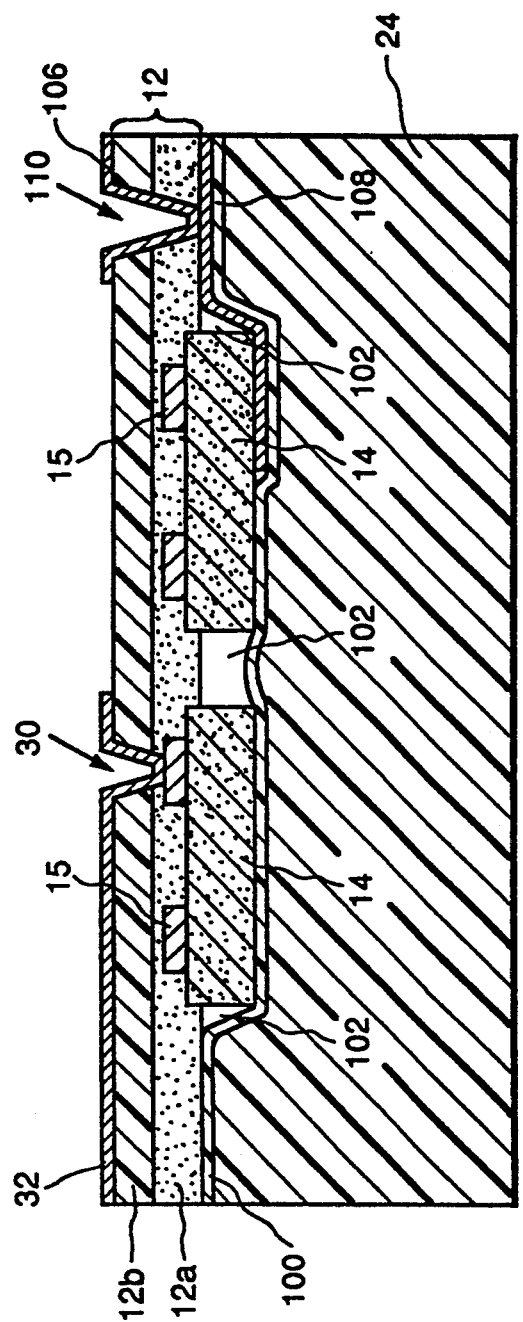
FIG. 4(e) is a view similar to that of FIG. 4(c), further showing the chips, the adhesive coated film layer, the inner dielectric layer, and the electrically conductive strip after the molding material has been formed, as well as interconnections in the adhesive coated film layer through vias extending to a contact pad and the electrically conductive strip.

As shown in FIG. 4(e), at least one via 30 is fabricated through base sheet 12 to allow contact to a chip pad. At the same time vias 30 are fabricated, a via 110 may be drilled through base sheet 12 to strip 108. An electrically conductive strip connection 106 to ground or a voltage source may be fabricated simultaneously with the pattern of electrical conductors 32 that are electrically connected to chip pads through vias 30.

Figure 5A:
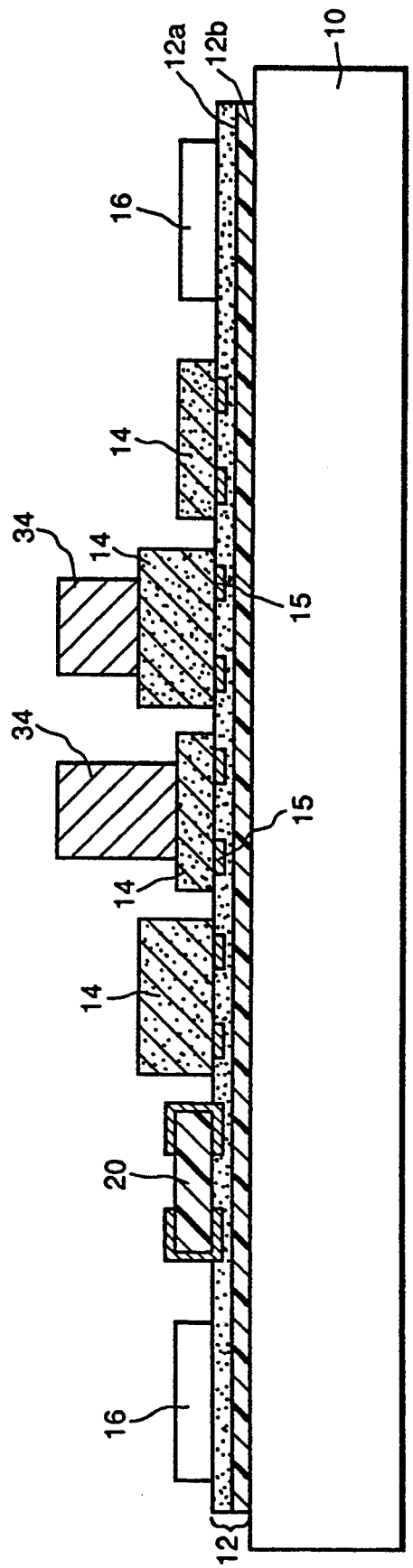
FIG. 5(a) is a view similar to that of FIG. 1(a), further including thermal plugs situated on passive backsides of the chips for enhanced heat removal.

FIG. 5(a) is a sectional side view of an embodiment of the invention similar to that shown in FIG. 1(a), further including thermal or thermo-electrical plugs, shown as thermal plugs 34, situated on passive backsides of chips 14. These plugs can be bonded to the chips by silver epoxy (not shown) for grounding purposes, if desired. The thermal conductivity required varies according to thermal dissipation characteristics of the module, environmental conditions of the planned application, and the projected life of the circuit. High thermal conductivity filler material, such as graphite, silver epoxy, or diamond, is sufficient for most high power applications. Thermal plugs 34 are useful is for extremely high power densities, such as those exceeding 100 watts per module. If desired, an inner dielectric layer, such as layer 100 shown in FIGS. 4(a)–4(e), can be placed over chips 14 prior to the addition of thermal plugs 34. Preferably, such inner dielectric layer would be ablated or thinned in the area where the thermal plugs are desired before the thermal plugs are placed on the chips.

Figure 5B:
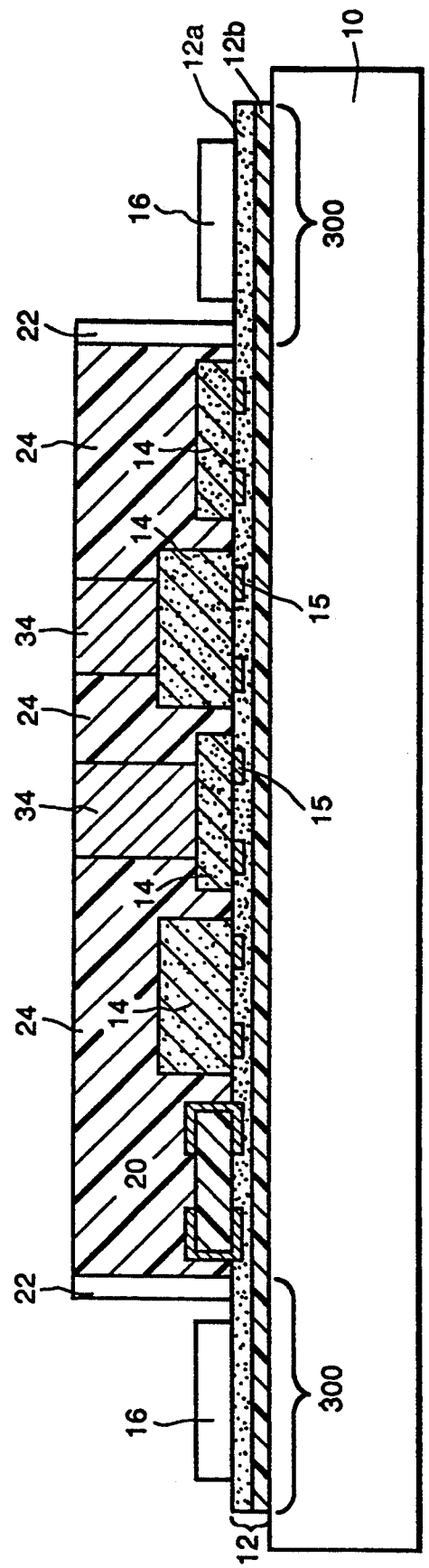
FIG. 5(b) is a view similar to that of FIG. 5(a), further showing a mold form situated around the chips and thermal plugs containing a molding material.

Thermal plugs 34 may comprise any thermally conductive material, including, for example, molybdenum or copper or a mixture, such as a silicon carbide matrix infiltrated with aluminum, as fabricated by Lanxide Corporation. Preferably the thermal plug both provides the necessary dissipation and has a coefficient of thermal expansion selected so as not to differ greatly from that of the chips. The thermal plugs can be attached to the backs of the chips following the step of attaching the chips to base sheet 12 but prior to the step of adding the molding material 24, which is shown in FIG. 5(b), using an epoxy attach material that may have a cure temperature ranging from room temperature to elevated temperatures insufficiently high to damage chips 14 and 20. Preferably the thicknesses of thermal plugs 34 are such that the surfaces opposite the surfaces attached to chips 14 are positioned on a common plane. This can be achieved by using appropriately thinner thermal plugs on thicker chips.

FIG. 5(b) is a sectional side view similar to that of FIG. 5(a), further showing mold form 22 situated around the chips and thermal plugs and filled with molding material 24. In the illustrated embodiment, the height of mold form 22 does not exceed that of the thermal plugs attached to the chips. Preferably thermal plugs 34 and mold form 22 are selected so that the resultant substrate and outer edges of the thermal plugs will be coplanar. Alternatively, common height thermal plugs may be used and, following hardening of the molding material, be mechanically or chemically planarized. The thermal plugs can provide a high thermal conduction path directly to a heat sink (not shown). Although not shown in FIG. 5(b), the thermal plugs may extend beyond the mold surface for enhanced heat sink attach or for mounting.

An HDI substrate molded in accordance with the abovedescribed embodiments can either be a drop-in substrate which is mounted in an enclosure for protection from the environment or a stand-alone component that is either directly mounted onto a board or utilized as a free standing module. The drop-in version can have external connections from the outermost interconnect layer of the HDI structure, such as layer 29 shown in FIG. 1(e).

In free standing modules, electrical interconnections from the HDI multi-chip module (MCM) can be made in a number of variations. Like the drop-in version, the interconnections can be made from the outermost interconnect layer of the HDI structure. This outermost interconnect layer can include area contact pads comprised of TI:Cu:TI:TiW:Au, for example. Gold is beneficial as the outermost connecting material because it is highly conductive and will not corrode. Alternatively, interconnect material may comprise Ti:Cu for connection by a solder attach process.

Another embodiment of the invention uses an interconnect structure molded into the substrate. One variation of this concept involves placement of a connector frame 39 (FIGS. 6(a) and 6(b)) around the chips prior to the molding step. The frame can provide connection pads coplanar with the chip faces. Thus FIG. 6(a), which is a sectional side view similar to that of FIG. 1(d), further shows a perimeter array of interconnect pins 36 having connection pads 37 in base sheet 12. Pins 36 extend through the surface of substrate 24 opposite the surface of base sheet 12 to which chips 14 and 20 are attached. These pins may be designed to be compatible with any connectors with which the pins will interface. For example, the pins can be fabricated for use with pin grid array sockets. A dielectric layer 40 can be used to cover and protect the pattern of electrical conductors 32.

Figure 6A:
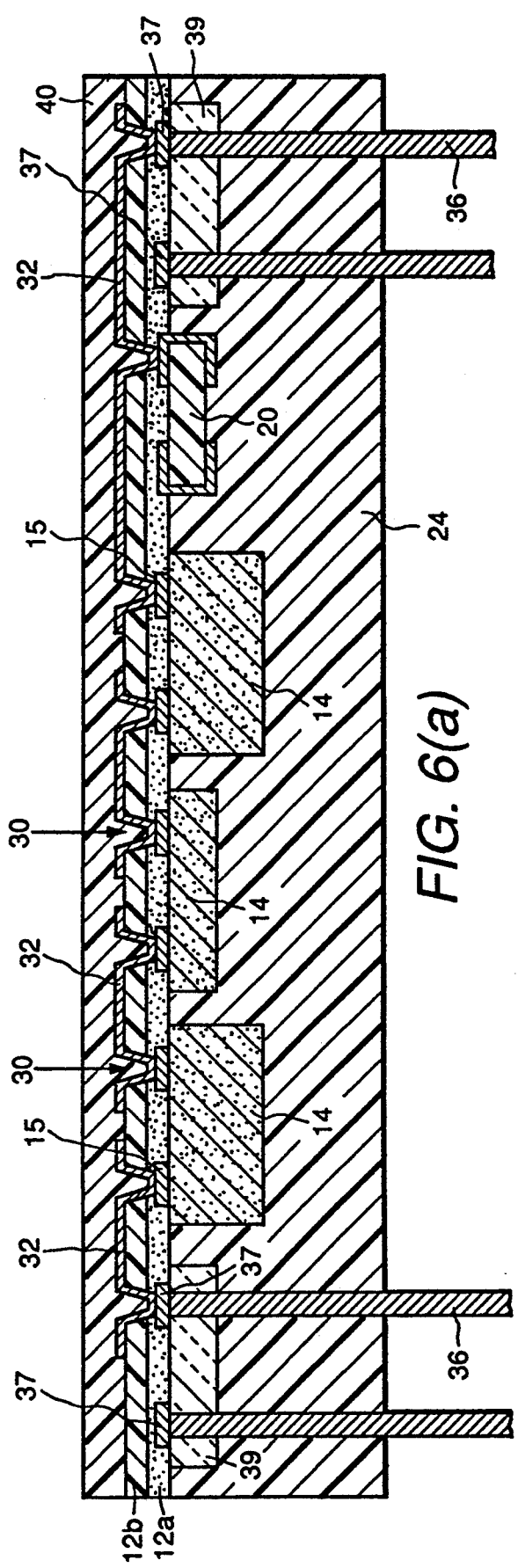
FIG. 6(a) is a view similar to that of FIG. 1(d), further showing a perimeter array of interconnect pins extending through the surface, or the substrate molding material opposite the surface to which the chips are attached.
Figure 6B:
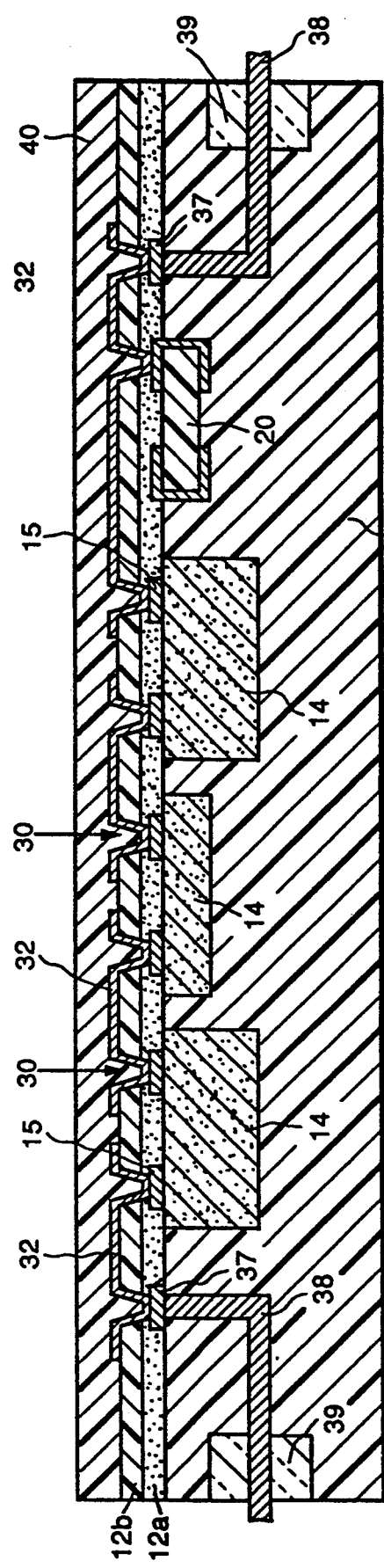
FIG. 6(b) is a view similar to that of FIG. 1(d), further showing a perimeter array of interconnect pins extending through a side of the substrate molding material.

FIG. 6(b) is a view similar to that of FIG. 6(a), except that the perimeter array of interconnect pins 38 extends through a side of substrate 24. This embodiment is useful for lower pin count modules, such as those applicable to automotive electronics. There are several methods for designing the side extensions. The mold form can have openings in the side which allow for placement of the connector frame. Alternatively, the pins, which are sufficiently longer than the molding material thickness, may be bent toward the side after the mold is cured or set. A dielectric layer, such as dielectric layer 100 shown in FIGS. 4(a)–4(e), can be placed over chips 14 prior to the addition of substrate material 24. Such dielectric layer has to be ablated in the area where the connectors (36 in FIG. 6(a) or 38 in FIG. 6(b)) will be placed.

Large arrays of substrates can be fabricated as one large wafer that can be readily cut apart either before or after the HDI fabrication is completed, thus reducing handling.

FIGS. 7(a)–7(d) are sectional side views of several alternative embodiments of the invention shown in FIGS. 1(a)–1(e). In these embodiments, there is no base sheet 12 (FIG. 1(a)), and a vacuum plate is used as base 10.

Figure 7A:
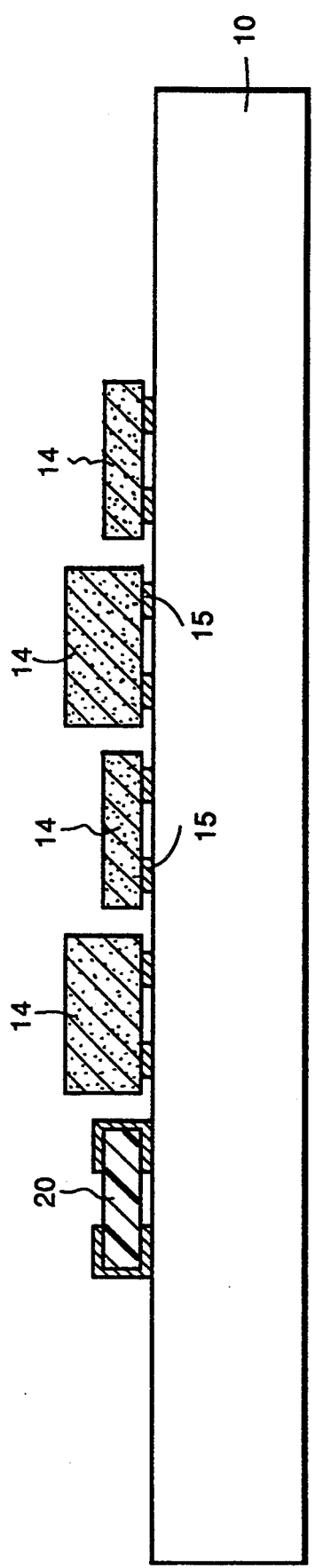
FIG. 7(a) is a sectional side view of chips face side down on a base comprising a vacuum plate.

In one embodiment, chips 14 are placed face down on base 10 comprising a vacuum plate, as shown in FIG. 7(a). The vacuum plate, which may comprise any appropriate structural material, is typically porous and may be coated with a mold release material (not shown), such as Teflon polytetrafluoroethylene, silicone, or a no-stick vegetable oil, for ease of removing hardened substrate molding material. Any orifices which are not covered by chips 14 are preferably masked so that the subsequently applied substrate molding material does not enter the vacuum plate. One mask technique is to apply a material such as Teflon polytetrafluoroethylene tape or thin silicone rubber sheets over any exposed orifices.

Figure 7B:
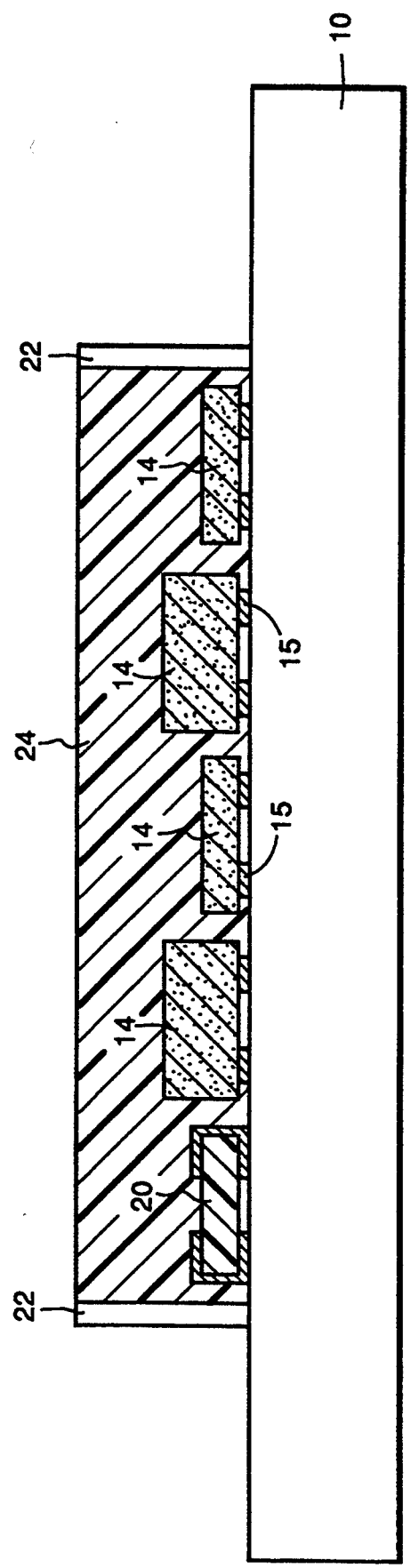
FIG. 7(b) is a view similar to that of FIG. 7(a), further showing a mold form situated around the chips and containing molding material.
Figure 7C:
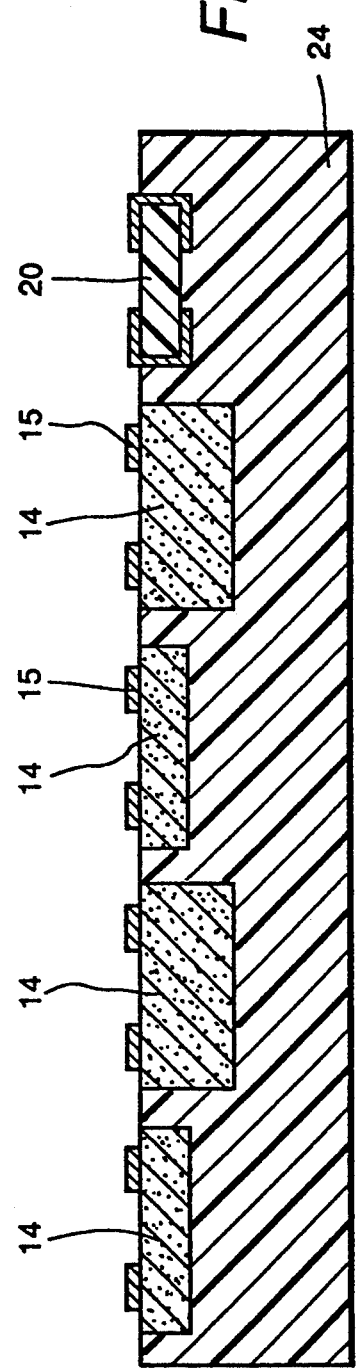
FIG. 7(c) is a view similar to that of 7(b), further showing embedded chips in substrate molding material after the mold form has been removed.

A continuous vacuum is applied to the vacuum plate throughout chip placement. The substrate is molded with molding material 24, as shown in FIG. 7(b), in a manner similar to that discussed with respect to FIG. 1(b). Chip pads 15 are preferably short enough so that molding material 24 does not flow under the chips. When a mold release material is on the vacuum plate and the chip pads are pressed into the release material, molding material is further prevented from flowing under the chips. FIG. 7(c) is a view similar to that of FIG. 7(b), further showing embedded chips in substrate molding material after the vacuum plate and the mold form have been removed. Then a dielectric layer, such as layer 13 shown and described with reference to FIG. 2(b), can be applied and an HDI structure can be fabricated by the steps discussed with respect to 1(c)–1(e).

Figure 7D:
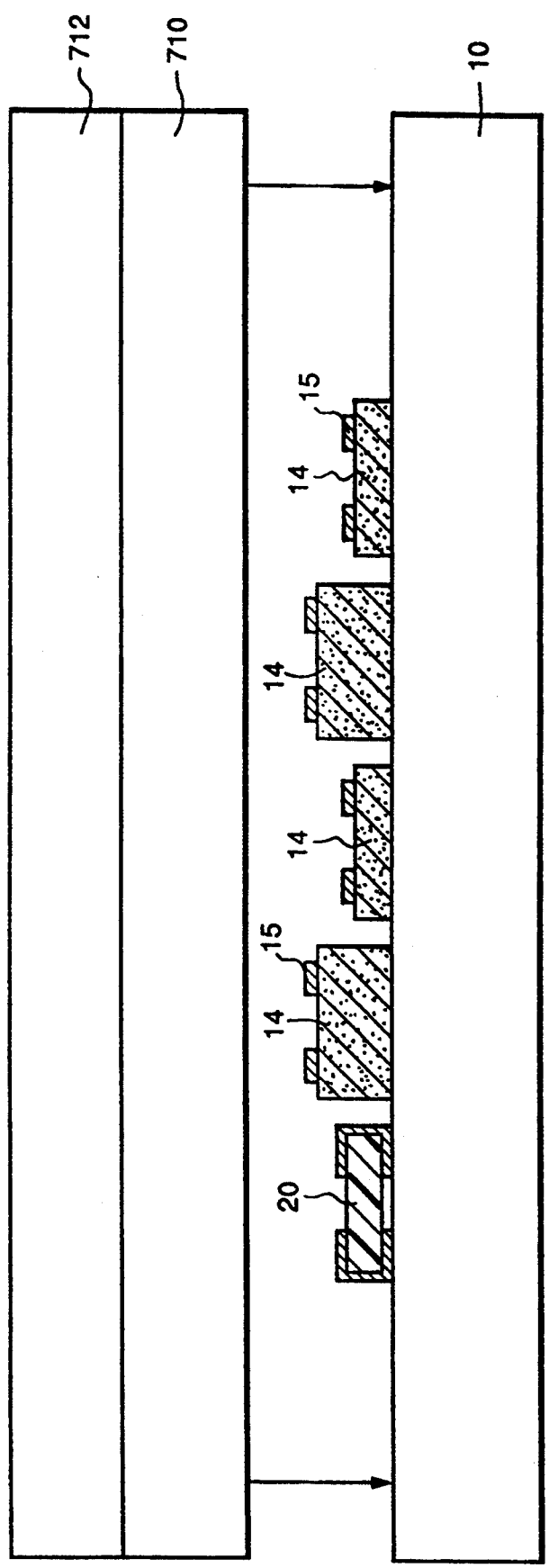
FIG. 7(d) is a sectional side view of chips face side up on a base comprising a rigid vacuum plate and a compliant vacuum plate for subsequent lathering onto the rigid vacuum plate.
Figure 7E:
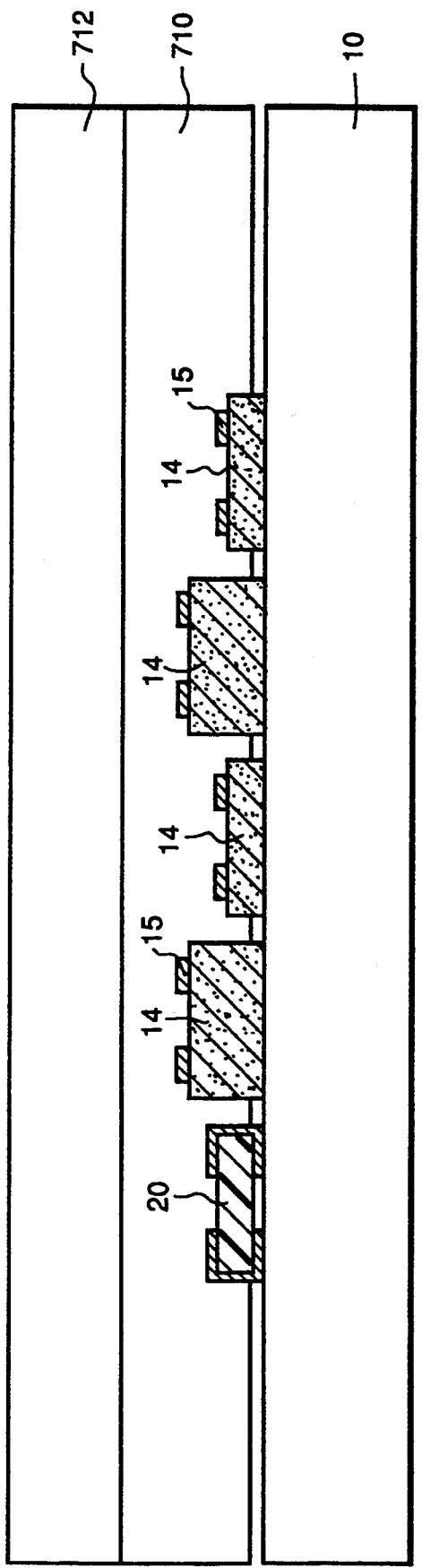
FIG. 7(e) is a view similar to that of FIG. 7(d), further showing the compliant vacuum plate in contact with the chips.
Figure 7F:
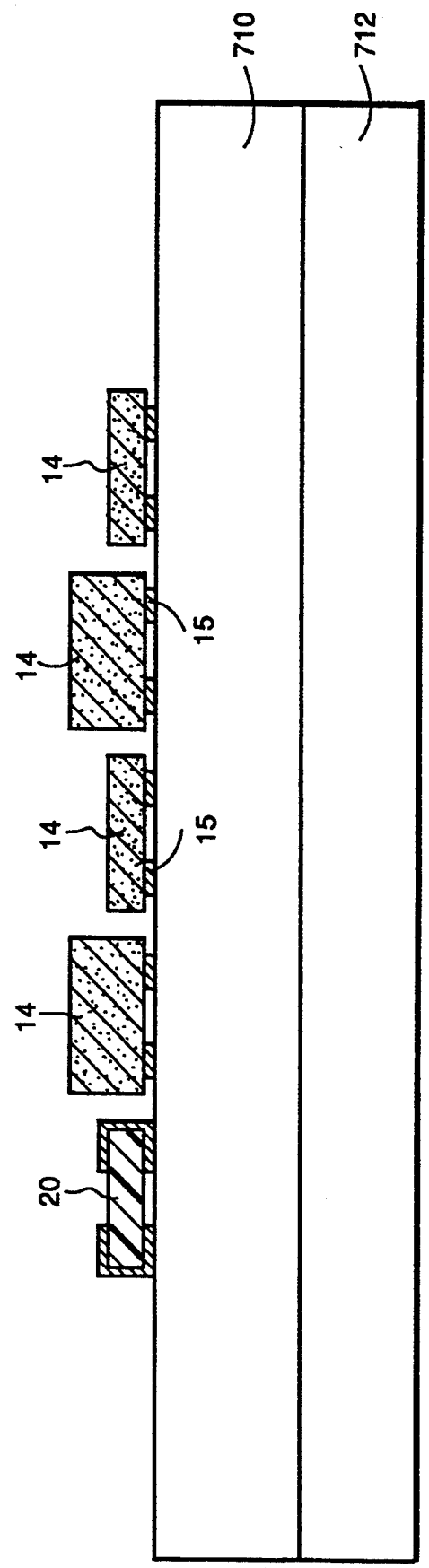
FIG. 7(f) is a view similar to that of FIG. 7(e), showing the compliant vacuum plate and chips after the removal of the rigid vacuum plate.

FIG. 7(d) illustrates another embodiment in which a vacuum plate is used. Base 10 is a rigid vacuum plate comprising a material such as stainless steel. The chips are positioned while a continuous vacuum is applied to the rigid vacuum plate. Then the chip locations are monitored and modified, if desired. The vacuum conditions remain while a second, non-compliant vacuum plate is pressed onto the top surface of the chips, which can be non-planar. As shown in FIG. 7(e), the compliant vacuum plate envelopes the chips. Preferably this compliant vacuum plate comprises two layers: one compliant layer 710 of material such as silicone rubber and one firm support layer 712 such as stainless steel. After the compliant vacuum plate is pressed around the chips, a continuous vacuum is applied to the compliant vacuum plate. The vacuum is then released from the rigid vacuum plate, and the rigid vacuum plate is removed. After the rigid vacuum plate is removed, the compliant vacuum plate is inverted while the chips remain on the compliant vacuum plate but are no longer pressed into the compliant vacuum plate. As shown in FIG. 7(f), the chips are in a similar position as the chips shown in FIG. 7(a). The remainder of steps in the HDI fabrication process are those discussed with respect to FIGS. 7(a)–7(c).

If desired, an inner dielectric layer 100, as discussed with is respect to FIGS. 4(a)–4(e), thermal plugs 34, as discussed with respect to FIGS. 5(a)–5(b), a connector frame 39, as discussed with respect to FIGS. 6(a)–6(b), or any combination of these features can be used in the embodiments disclosed with respect to FIGS. 7(a)–7(f). The only difference would be that an inner dielectric layer or a connector frame would be applied on a vacuum plate instead of on a base sheet.

Figure 8B:
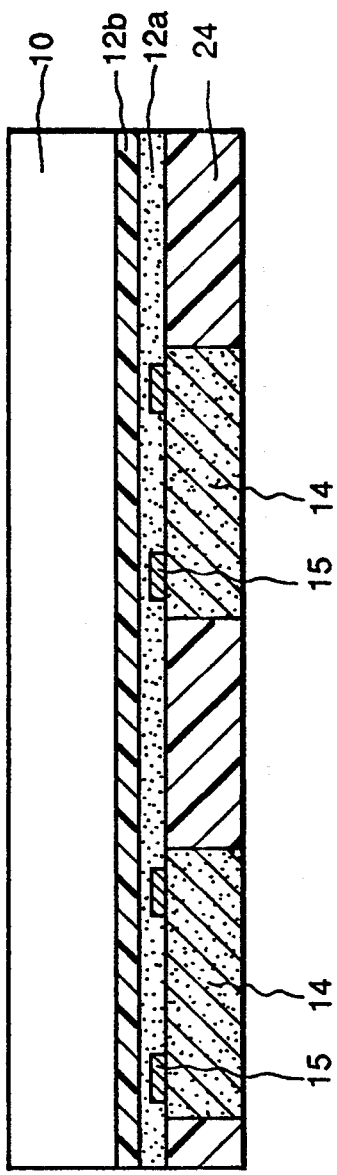
FIG. 8(b) is a view similar to that of FIG. 8(a), showing the chips and substrate after a portion has been removed.

FIGS. 8(a)–8(e) are sectional side views of alternative embodiments of the invention which are similar to the views shown in FIGS. 1(a)-1(e). The embodiment in FIG. 8(a) is similar to a partial view of FIG. 1(b) except that substrate 24 has been inverted and a mechanical grinding fixture 810 has been provided. The mechanical grinding fixture is used to grind down the backside of the substrate to a desired thickness, which may be to the bottom surface of a chip 14, part way through the chip, or to a thickness somewhat greater than the chip thickness. Thinning a substrate saves space and lowers thermal resistance.

During the grinding, the substrate molding material surrounding the chips holds the chips in place and helps protect the chips from chipping or cracking. This process is not limited to mechanical grinding; other techniques are available for removing substrate material and thinning the structure, such as, for example, chemically dissolving the selected portion of the substrate molding material. Commonly assigned Wojnarowski, "Thinning of Integrated Circuit Chips for Lightweight Packaged Electronic Systems and Systems Produced Therefrom," application Ser. No. 07/962,379, filed Oct. 16, 1992, discloses additional thinning options such as ultrasonic milling, micro blasting, milling, laser cutting, and using a lapping machine, and is herein incorporated by reference.

Figure 8C:
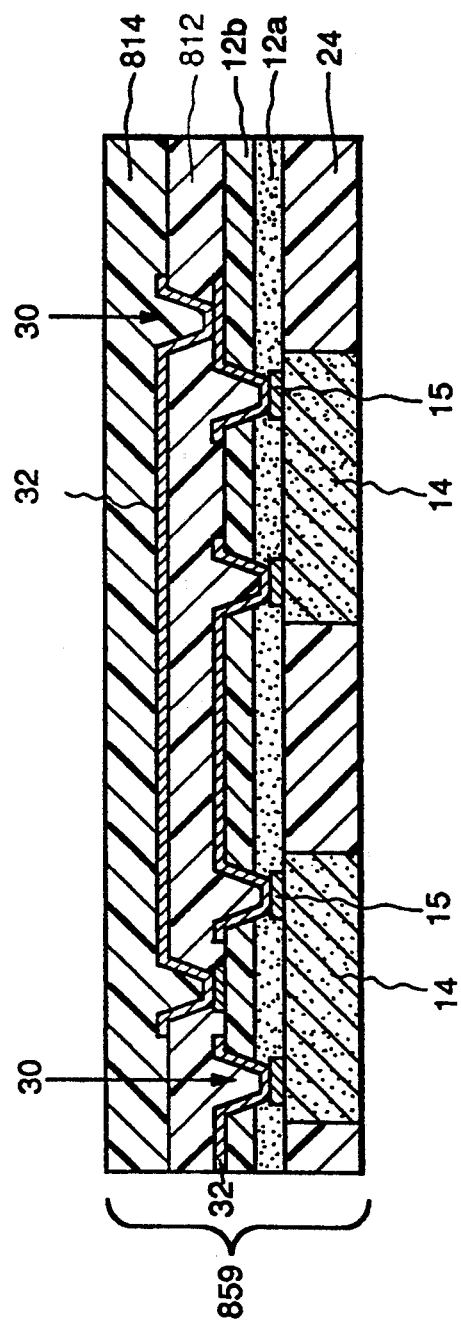
FIG. 8(c) is a view similar to that of FIG. 8(b), further showing interconnect layers over the chips.

After substrate 24 is thinned, it appears as shown in FIG. 8(b). Then base 10 is removed, and an integrated circuit module (shown as HDI structure 859), similar to that discussed with respect to the embodiment of FIGS. 1(c)-1(e), can be fabricated, as shown in FIG. 8(c) where upper interconnect layers 812 and 814 overlie polymer film layer 12b and chips 14 are interconnected by a pattern of electrical conductors 32. The substrate thinning process can be used in combination with any of the techniques discussed with respect to the embodiments of FIGS. 1(a)-7(f), except that chips would preferably not be thinned in the embodiments of FIGS. 4(a)-4(e) and, because of the lower thermal resistance of thinned structures, thermal plugs 34 (FIGS. 5(a)-5(b)) are not as necessary as the plugs might be in thicker structures.

Figure 8D:
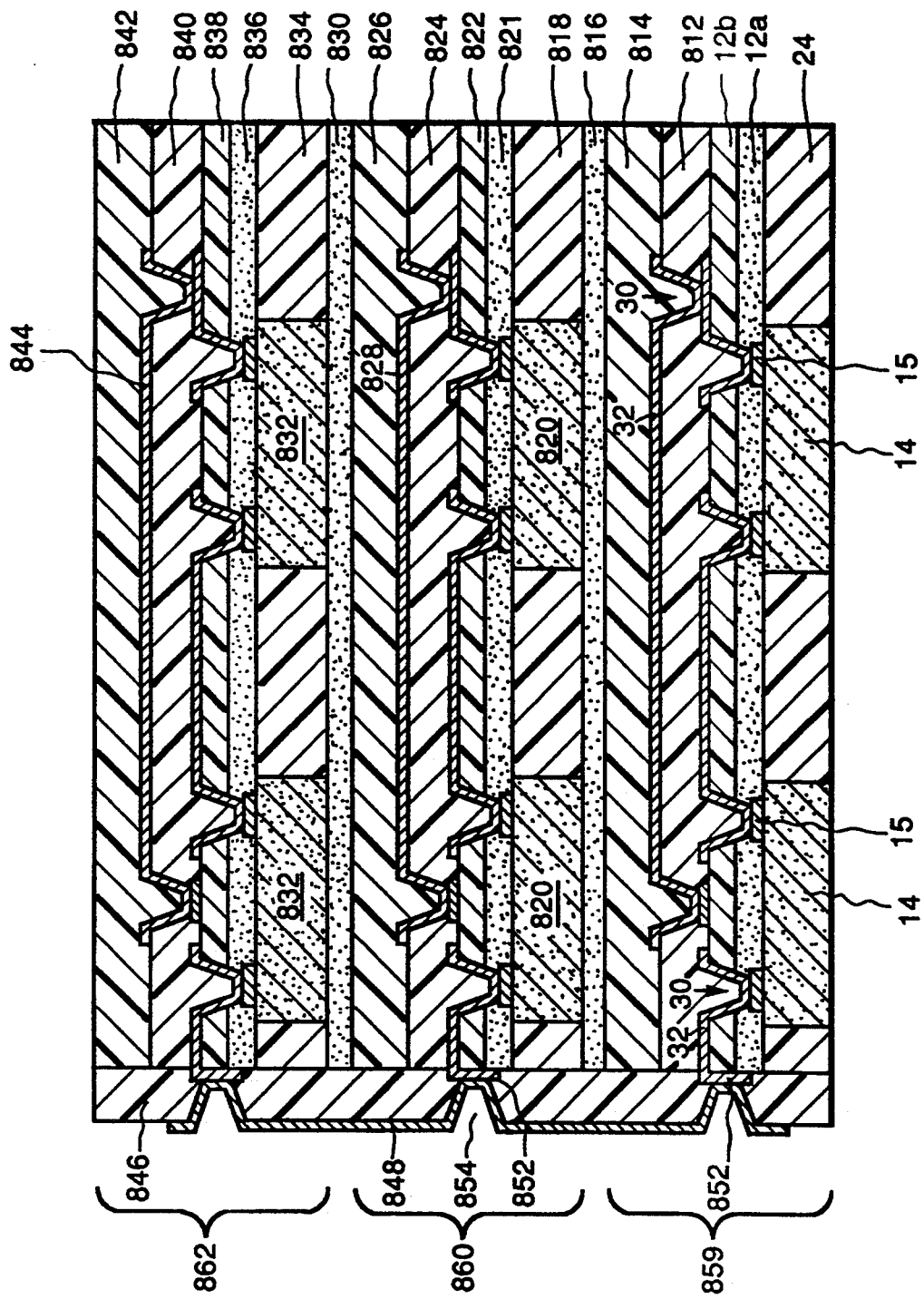
FIG. 8(d) is a view showing a stack of thinned chips having interconnect layers with edge contacts.

These HDI structures can be stacked, as shown in the embodiment of FIG. 8(d). In one type of stacking, edge metallization contacts 852 are used. Methods for fabricating these contacts are disclosed in Eichelberger et al., U.S. Pat. No. 5,019,946, issued May 28, 1991, and Gorczyca et al., "Edge-Metallized High Density Interconnect Substrates to Enable Fabrication and Interconnection of Three-Dimensional Modules," application Ser. No. 07/959,886, filed Oct. 13, 1992, both of which are commonly assigned and incorporated herein by reference.

HDI structure 859 of FIG. 8(d) is coated with an adhesive layer 816 so that at least one additional HDI structure 860 can be attached. HDI structure 860 is provided with thinned chips 820 in thinned substrate 818. An adhesive layer 821 is positioned between the top face of thinned substrate 818 and a dielectric layer 822 having a pattern of electrical conductors 828 with edge contact pads 852 for interconnecting the chips. More interconnections can be provided by an optional additional dielectric layer 824. Dielectric layer 826 is useful as a buffer between HDI structure 860 and another HDI structure 862.

HDI structure 862 is stacked on a top surface, shown as dielectric layer 826 of HDI structure 860. An adhesive layer 830 bonds the bottom surface of HDI structure 862 to the top surface of HDI structure 860. High density interconnect structure 862 is provided with thinned chips 832 in thinned substrate 834. An adhesive layer 836 is positioned between the top face of thinned substrate 834 and a dielectric layer 838 having a pattern of electrical conductors 844 with edge contact pads 852 for interconnecting the chips. More interconnections can be provided by an optional additional dielectric layer 840. Dielectric layer 842 is useful as a buffer for HDI structure 862.

An edge dielectric layer 846 is applied to a side of the stack having edge contact pads by an adhesive (not shown) and vias 854 are formed over selected edge pads. Then a conductive metal track structure 848, positioned on the exposed side of dielectric layer 846, electrically connects, through the vias, at least some of the edge contact pads.

Figure 8E:
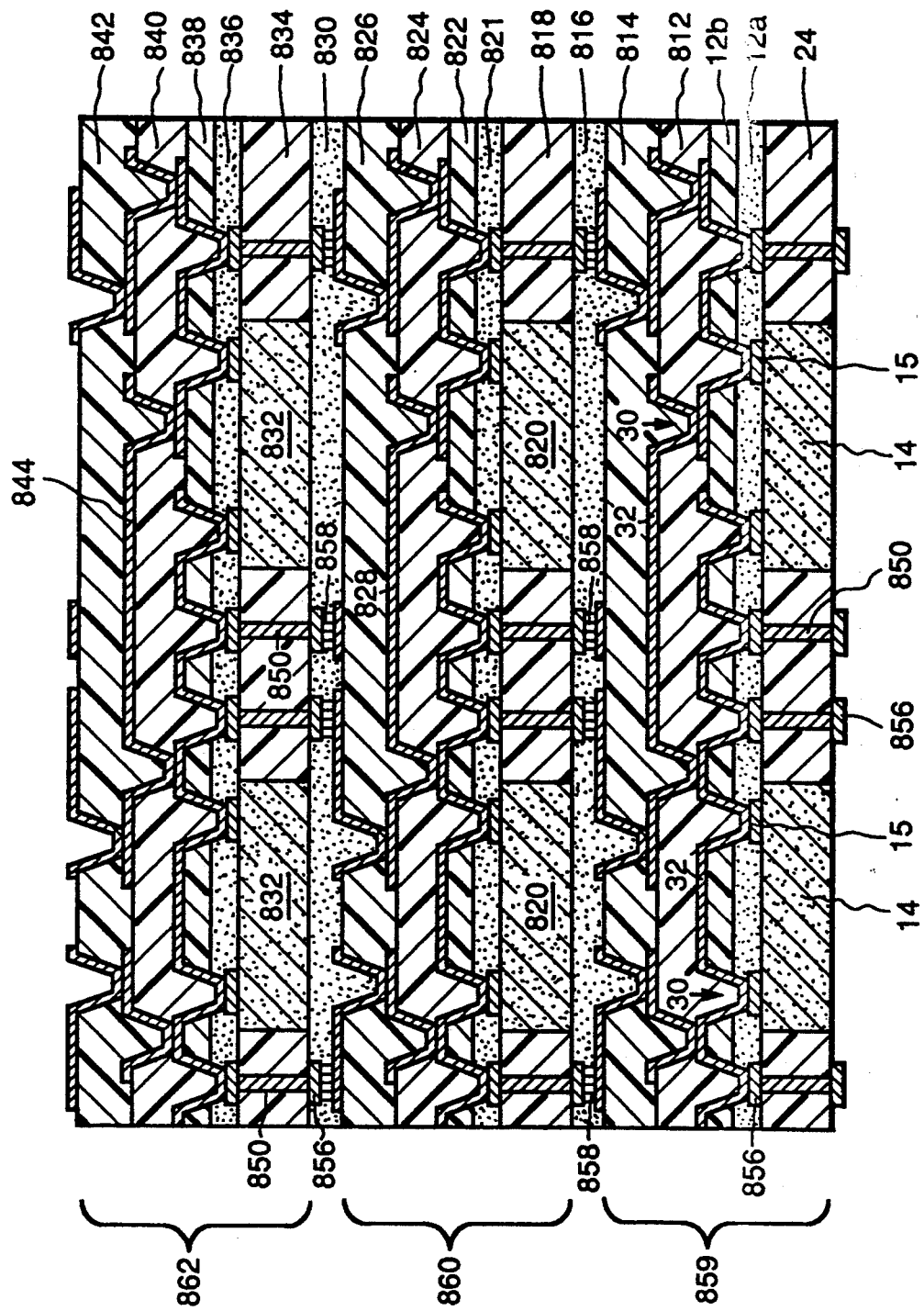
FIG. 8(e) is a view showing a stack of thinned chips interconnected by substrate pins.

FIG. 8(e) illustrates an alternative method of stack assembly and interconnect. In this embodiment the stacks are formed in a similar manner as previously described, except that instead of using edge contact pads 852 (FIG. 8(d)) an array of substrate pins 850 is molded into each plastic substrate during the initial molding process. Pin contact pads 856 can be deposited onto the top and bottom pin surfaces by applying and patterning a metal such as gold.

Area input/output (I/O) contacts 858 such as, for example, fuzz buttons, elastomers, and solder bumps, are located at the pad sites to interconnect the HDI structures. Fuzz buttons are typically round balls of fine electrically conductive fibers. One method of applying them is to place a spacer layer (not shown) having holes above selected portions of the pattern of electrical conductors. Fuzz pads can then be inserted into the holes, and the next HDI structure can be applied. Conductive elastomer contacts can be fabricated by using a sheet (not shown) having vertically aligned contacts which touch when squeezed together. The sheet is positioned on a top surface of an HDI structure so that the vertical contacts are situated above selected portions of the pattern of electrical conductors. Then an HDI structure is applied. With both elastomer contacts and fuzz buttons, it is useful to have a clamp (not shown) or some other means for pressing the HDI structures together. Additionally, silicone epoxy can be used near the I/O interfaces during clamping for securing the structures after a clamp is removed. A spacer is also useful for solder bumps. In this case, no clamp is needed because the bumps are heated to form connections.

Interconnection from the stacked module to the next level of packaging can be made from either the top pads or the bottom pads, as required. The thin profile and the excellent thermal path permits many more levels in the stack than are available in a conventional HDI stack.

While only certain preferred features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A method of fabricating an integrated circuit module substrate on a base, comprising the steps of:
   applying an insulative base sheet over said base, said base sheet comprising a polymer film having an adhesive coating situated on the side of the polymer film opposite said base;
   placing a plurality of chips having contact pads face down on said base sheet;

positioning a mold form around said chips;
adding substrate molding material within said mold form;
hardening said substrate molding material;
separating said base from said base sheet;
forming a plurality of vias through said base sheet, some of said plurality of vias being aligned with predetermined ones of said contact pads; and
providing a pattern of electrical conductors extending through selected ones of said plurality of vias in said base sheet to form an integrated circuit module.

2. The method of claim 1, further including the step of removing said mold form from said substrate molding material after hardening said substrate molding material.

3. The method of claim 1, wherein said substrate molding material comprises plastic.

4. The method of claim 1, wherein said substrate molding material comprises material selected from the group consisting of aliphatic and aromatic polymers.

5. The method of claim 4, wherein said substrate molding material comprises material selected from the group consisting of thermoplastic and thermoset polymers.

6. The method of claim 5, wherein said substrate molding material comprises material selected from the group consisting of polyetherimide resins, polytetrafluoroethylenes, epoxy, benzocyclobutene, acrylates, polyurethanes, polyimides, and polyimide resins.

7. The method of claim 3, wherein said molding material includes therein filler material in a configuration selected from the group consisting of particles, fibers, screens, mats, and plates.

8. The method of claim 7, wherein said filler material is selected from the group consisting of glass, SiC, AlN, diamond, graphite, $Al_2O_3$, and metal.

9. The method of claim 1, wherein said substrate molding material comprises a blend of polyimide, epoxy, and crosslinking catalyst.

10. The method of claim 9, wherein the step of hardening includes heating said substrate molding material at temperatures ranging from 25° C. to 250° C.

11. The method of claim 9, wherein said substrate molding material further includes therein particles of material selected from the group consisting of alumina, aluminum nitride, aluminum silicon carbide, aluminum, and diamond.

12. The method of claim 9, wherein the adhesive coating on said polymer film layer comprises the same material as said substrate molding material, and further comprising the step of hardening said adhesive coating simultaneously with said substrate molding material.

13. The method of claim 1, further including the step of affixing a thermal plug on the backside of at least one of said chips prior to adding said substrate molding material within said mold form.

14. The method of claim 1, further including the step of placing a connector frame including connection pads coplanar with said contact pads around said chips prior to adding said substrate molding material.

15. The method of claim 14, wherein said connector frame further comprises an array of pins which extend at least through said substrate molding material to the surface thereof.

16. The method of claim 14, wherein said connector frame further comprises an array of pins which extend at least through to the side of said substrate molding material.

17. The method of claim 1, further including the step of applying an inner dielectric layer over the backside of said chips and said base sheet prior to providing said mold form.

18. The method of claim 17, further including the steps of providing an electrically conductive strip on said inner dielectric layer prior to applying said inner dielectric layer over said chips and wherein said conductive strip is applied onto a region that extends from a portion of the backside of at least one of said chips to a portion of said base sheet.

19. The method of claim 18, further including the final step of providing an electrical connection from said electrically conductive strip to one of the group consisting of a voltage source and ground.

20. The method of claim 1, further including the step of removing a portion of said substrate molding material after hardening said substrate molding material.

21. The method of claim 20, wherein the step of removing said portion of said substrate molding material includes removing a corresponding portion of at least one of said chips.

22. The method of claim 20, further including the final steps of stacking said integrated circuit module with at least one additional integrated circuit module; and interconnecting at least one contact pad of said integrated circuit module with at least one contact pad of said at least one additional integrated circuit module.

23. The method of claim 22, wherein the step of providing a pattern of electrical conductors further includes forming edge contact pads and wherein the step of interconnecting said at least one contact pad of said integrated circuit module with said at least one contact pad of said at least one additional integrated circuit module comprises:
bonding an edge dielectric layer to at least one side of said stacked module having said edge contacts exposed thereon;
forming a plurality of side vias through said edge dielectric layer in alignment with at least some of said edge contact pads; and
depositing a conductive metal track structure on said edge dielectric layer on said at least one side of said stacked module to provide electrical connection between at least some of said edge contact pads through said side vias.

24. The method of claim 22, further including the step of positioning electrically conductive substrate pins in predetermined locations on said base prior to adding said substrate molding material within said mold form; and
wherein the step of stacking said integrated circuit module with at least one additional integrated circuit module includes aligning predetermined substrate pins of said at least one additional integrated circuit module with predetermined portions of said pattern of electrical conductors of said integrated circuit module.

25. A method of fabricating an integrated circuit module substrate on a base, comprising the steps of:
applying an insulative base sheet over said base, said base sheet comprising a polymer film having an adhesive coating situated on the side of the polymer film opposite said base;
placing a plurality of chips having contact pads face down on said base sheet;

positioning a mold form around said chips;
adding substrate molding material within said mold form;
hardening said substrate molding material;
separating said substrate molding material and said chips from said base sheet and base;
applying a dielectric layer over said chips and said substrate molding material;
forming a plurality of vias through said dielectric layer, some of said plurality of vias being aligned with predetermined ones of said contact pads; and
providing a pattern of electrical conductors extending through selected ones of said plurality of vias in said dielectric layer to form an integrated circuit module.

26. The method of claim 25, wherein said substrate molding material comprises plastic.

27. The method of claim 26, wherein said molding material includes therein filler material selected from the group consisting of glass, SiC, AlN, diamond, graphite, $Al_2O_3$, and metal.

28. The method of claim 25, further including the step of applying an inner dielectric layer over the backside of said chips and said base sheet prior to providing said mold form.

29. The method of claim 28, further including the steps of providing an electrically conductive strip on said inner dielectric layer prior to applying said inner dielectric layer over said chips and wherein said conductive strip is applied onto a region that extends from a portion of the backside of at least one of said chips to a portion of said base sheet.

30. The method of claim 29, further including the final step of providing an electrical connection from said electrically conductive strip to one of the group consisting of a voltage source and ground.

31. The method of claim 25, further including the step of removing a portion of at least one of said chips and of said substrate molding material after hardening said substrate molding material.

32. The method of claim 31, further including the final steps of stacking said integrated circuit module with at least one additional integrated circuit module; and interconnecting at least one contact pad of said integrated circuit module with at least one contact pad of said at least one additional integrated circuit module.

33. A method of fabricating an integrated circuit module substrate on a base, comprising the steps of:
applying an insulative base sheet over said base, said base sheet comprising an adhesive layer;
placing a plurality of chips having contact pads face down on said base sheet;
positioning a mold form around said chips;
adding substrate molding material within said mold form;
hardening said substrate molding material;
separating said substrate molding material and said adhesive layer from said base;
applying a dielectric layer over said adhesive layer;
forming a plurality of vias through said dielectric layer, some of said plurality of vias being aligned with predetermined ones of said contact pads; and
providing a pattern of electrical conductors extending through selected ones of said plurality of vias in said dielectric layer to form an integrated circuit module.

34. The method of claim 33, wherein said substrate molding material comprises plastic.

35. The method of claim 34, wherein said molding material includes therein filler material selected from the group consisting of glass, SiC, AlN, diamond, graphite, $Al_2O_3$ and metal.

36. The method of claim 33, further including the step of applying an inner dielectric layer over the backside of said chips and said base sheet prior to providing said mold form.

37. The method of claim 36, further including the steps of providing an electrically conductive strip on said inner dielectric layer prior to applying said inner dielectric layer over said chips and wherein said conductive strip is applied onto a region that extends from a portion of the backside of at least one of said chips to a portion of said base sheet.

38. The method of claim 33, further including the step of removing a portion of at least one of said chips and of said substrate molding material after hardening said substrate molding material.

39. The method of claim 38, further including the final steps of stacking said integrated circuit module with at least one additional integrated circuit module; and interconnecting at least one contact pad of said integrated circuit module with at least one contact pad of said at least one additional integrated circuit module.

40. A method of fabricating an integrated circuit module substrate on a base, comprising the steps of:
applying an insulative base sheet over said base, said base sheet comprising a polymer film having an adhesive coating situated on the side of the polymer film opposite said base;
placing a chip having contact pads face down on said base sheet;
positioning a mold form around said chip;
adding substrate molding material within said mold form;
hardening said substrate molding material;
separating said base sheet from said base;
forming a plurality of vias through said base sheet, some of said plurality of vias being aligned with predetermined ones of said contact pads; and
providing a pattern of electrical conductors extending through selected ones of said plurality of vias in said base sheet.

41. A method of fabricating an integrated circuit module substrate, comprising the steps of:
placing a plurality of chips having contact pads face down on a vacuum plate;
applying a continuous vacuum to said vacuum plate;
positioning a mold form around said chips;
adding substrate molding material within said mold form;
hardening said substrate molding material;
separating said substrate molding material and said chips from said vacuum plate;
applying a dielectric layer over said chips and said substrate molding material;
forming a plurality of vias through said dielectric layer, some of said plurality of vias being aligned with predetermined ones of said contact pads; and
providing a pattern of electrical conductors extending through selected ones of said plurality of vias in said dielectric layer to form an integrated circuit module.

42. The method of claim 41, further including the step of applying an inner dielectric layer over the backside of said chips and said vacuum plate prior to providing said mold form.

43. The method of claim 41, wherein said vacuum plate comprises a compliant vacuum plate and wherein the step of placing said plurality of chips on said compliant vacuum plate comprises:

placing said plurality of chips face up on a rigid vacuum plate;

applying a continuous vacuum to said rigid vacuum plate;

pressing said compliant vacuum plate on the faces of said plurality of chips;

releasing the continuous vacuum from said rigid vacuum plate; and removing said rigid vacuum plate from said plurality of chips.

44. The method of claim 43, wherein said rigid vacuum plate comprises stainless steel.

45. The method of claim 43, wherein said compliant vacuum plate comprises silicone rubber.

46. The method of claim 41, further including the step of removing a portion of at least one of said chips and of said substrate molding material after hardening said substrate molding material.

* * * * *